(12) United States Patent
Shimizu et al.

(10) Patent No.: US 6,634,290 B1
(45) Date of Patent: Oct. 21, 2003

(54) MASK-PRINTING APPARATUS AND METHOD INCLUDING INSPECTION OF PRINTED MATERIAL AND RE-PRINTING STEP

(75) Inventors: Toshinori Shimizu, Kariya (JP); Jun Adachi, Nagoya (JP); Manabu Mizuno, Toyota (JP)

(73) Assignee: Fuji Machine Mfg. Co., Ltd., Chiryu (JP)

( * ) Notice: Subject to any disclaimer, the term of this patent is extended or adjusted under 35 U.S.C. 154(b) by 388 days.

(21) Appl. No.: 09/625,304

(22) Filed: Jul. 24, 2000

(30) Foreign Application Priority Data

Aug. 10, 1999 (JP) ............................................. 11-226586

(51) Int. Cl.7 ................................................ B41F 15/14
(52) U.S. Cl. ........................ 101/129; 101/485; 101/114; 101/126; 101/425
(58) Field of Search .................................. 101/121, 123, 101/114, 126, 129, 423, 424, 485, 486, 124, 425; 118/213, 406

(56) References Cited

U.S. PATENT DOCUMENTS

| 4,324,815 A | | 4/1982 | Mitani et al. |
| 4,945,829 A | * | 8/1990 | Ericsson ..................... 101/129 |
| 4,981,074 A | * | 1/1991 | Machita et al. ................ 101/35 |
| 5,176,078 A | * | 1/1993 | Homma et al. ............. 101/126 |
| 5,241,187 A | * | 8/1993 | Ikeda et al. .................. 250/548 |
| 5,450,204 A | * | 9/1995 | Shigeyama et al. ......... 356/378 |
| 5,701,821 A | | 12/1997 | Asai et al. |
| 5,912,984 A | * | 6/1999 | Michael et al. ............. 382/149 |
| 6,058,835 A | | 5/2000 | Isogai et al. |

FOREIGN PATENT DOCUMENTS

| JP | 3-193449 | 8/1991 |
| JP | 5-50578 | 3/1993 |
| JP | A 6-238867 | 8/1994 |
| JP | 9-39214 | 2/1997 |
| JP | A 5-50578 | 12/1997 |

* cited by examiner

*Primary Examiner*—Leslie J. Evanisko
(74) *Attorney, Agent, or Firm*—Oliff & Berridge, PLC

(57) ABSTRACT

A method of printing a printing material on an object, including the steps of printing the printing material on the object through a mask having at least one through-hole formed through a thickness thereof, inspecting the printing material printed on at least one portion of the object through the at least one through-hole of the mask, and re-printing, when the inspection shows that an amount of the printing material printed on the at least one portion of the object is short, the printing material on the at least one portion of the object through the at least one through-hole of the mask to compensate for the short amount of the printing material.

23 Claims, 15 Drawing Sheets

MASK-PRINTING APPARATUS AND METHOD INCLUDING INSPECTION OF PRINTED MATERIAL AND RE-PRINTING STEP

BACKGROUND OF INVENTION

1. Field of Invention

The present invention relates to a mask-printing method and a mask-printing apparatus and particularly to the art of dealing with a defective printing.

2. Related Art Statement

A mask printing is carried out for, e.g., printing a creamed solder on a printed wiring board ("PWB"). More specifically described, a mask having one or more through-holes is superposed on the PWB, and the creamed solder is moved on the mask and is squeezed into the through-holes of the mask, so that the creamed solder is applied to the PWB. However, a defective mask printing may occur. A defective mask printing may be a printing with an insufficient amount of creamed solder, or a printing at an incorrect position on the PWB. To deal with this problem, Japanese Patent Application laid open under Publication No. 5-50578 teaches inspecting whether a creamed solder has been appropriately printed on a PWB and, if a defective printing is found, solving the cause of the defective printing to prevent the same defective printing from repeating two or more times.

Thus, the prior-art document teaches solving the cause of the defective printing. However, the PWB with the defective printing is dealt with as a defective object, and is discarded out of a production line.

SUMMARY OF INVENTION

The present invention provides a mask-printing method and a mask-printing apparatus which have one or more of the following technical features that are described in below in respective paragraphs given parenthesized sequential numbers (1) to (19). Any technical feature that includes another technical feature shall do so by referring, at the beginning, to the parenthesized sequential number given to the latter feature. Thus, two or more of the following technical features may be combined, if appropriate. Each technical feature may be accompanied by a supplemental explanation, as needed. However, the following technical features and the appropriate combinations thereof are just examples to which the present invention is by no means limited. In addition, in the case where one technical feature recites a plurality of items, it is not essentially required that all of those items be simultaneously employed. That is, it is possible to select and employ only a portion (one, two, but not all) of those items.

(1) According to a first feature of the present invention, there is provided a method of printing a printing material on an object, comprising the steps of printing the printing material on the object through a mask having at least one through-hole formed through a thickness thereof; inspecting the printing material printed on at least one portion of the object through the at least one through-hole of the mask; and re-printing, when the inspection shows that an amount of the printing material printed on the at least one portion of the object is short, the printing material on the at least one portion of the object through the at least one through-hole of the mask to compensate for the short amount of the printing material.

The printing material may be a creamed solder or an adhesive. The object may be a printed wiring board ("PWB"), or an externally exposed substrate of a "leadless" electric component having no lead wires. The leadless electric component is a package electric component which is provided by a container and chip components held by the container. The mask may be a screen mask formed of fibers, a combination mask obtained by reinforcing a screen mask with metal, or a stencil mask formed of metal. The shortage of the amount of the printing material may be compensated, according to the second feature (2) described below, by carrying out the mask-printing operation once more over the entire portion of the object. In an alternative manner, the mask is not used, and a device which can print the printing material on only a d&sired portion of the object is employed, so that the printing material is printed on only one or more print spots where the shortage of printing-material amount has been found. The inspection may be carried out on all the print spots of the object where the printing material has been printed, or on only a portion (one, two, . . ., but not all) of the print spots. In the latter case, the inspection may be carried out on a particular portion of the print spots where the shortage of printing-material amount is likely to occur, or a portion of the print spots that is random-sampled for each of objects. The re-printing can compensate for the short amount of printing material, and the object on which the shortage of printing-material amount has occurred need not be discarded as a defective. Thus, in the case where the object is a PWB and the printing of the printing material is carried out as one step of a printed-circuit board producing method, the number of PWBs that are discarded from the production line can be largely reduced.

(2) According to a second feature of the present invention that includes the first feature (1), the printing step comprises printing the printing material on a plurality of portions of the objects through the mask having a plurality of through-holes formed through the thickness thereof, the inspecting step comprises inspecting the printing material printed on at least one of the plurality of portions of the object through at least a corresponding one of the plurality of through-holes of the mask, and the re-printing step comprises re-printing, when the inspection shows that an amount of the printing material printed on the at least one portion of the object is short, the printing material on each of the plurality of portions of the object through a corresponding one of the plurality of through-holes of the mask.

The re-printing step may be the same step as the printing step and accordingly may be easily carried out by repeating the printing step.

(3) According to a third feature of the present invention that includes the second feature (2), the re-printing step comprises re-printing the printing material on the each portion of the object through the corresponding one through-hole of the mask, such that an amount of the printing material squeezed into the one through-hole in the re-printing step is smaller than the amount of the printing material squeezed into the one through-hole in the printing step.

This feature may be achieved by, e.g., decreasing the pressure under which the printing material is squeezed into the through-hole, or the time duration during which the printing material is squeezed into the through-hole. Since some amount of the printing material is, though being short, already present on the object, a total amount of the printing material printed on the object would be excessive if the same amount of printing material as that printed in the printing step is printed in the re-printing step. However, this feature is free of the problem that an excessive amount of printing material is printed on an object.

(4) According to a fourth feature of the present invention that includes any one of the first to third features (1) to (3), the inspecting step comprises taking, with an image taking device, an image of a surface of the object on which the printing material has been printed, and finding, based on the taken image, the shortage of the amount of the printing material.

The shortage of the printing material printed on the object can occur in various manners. For example, the height of the printing material is insufficient, or the printing material has a chip, i.e., no printing material is printed on at least a portion of a print area on which the material should be printed. The image taking device may be provided by a two-dimensional-image taking device which is used in combination with a planar-light source; or a laser displacement sensor disclosed in the above-identified Japanese Patent document No. 5-50578. The laser displacement sensor includes a laser-beam generator, an optical system, and a reflected-light converging device, emits a laser beam toward the printing material, and takes an image of the printing material based on the light or laser beam reflected from the material. To take an image of the material, at least one of the sensor and the material is moved relative to the other of the sensor and the material. Otherwise, the image taking device may be one which takes a plan image of the printing material. The last image taking device can find the chip of the printing material. In the last case, at least one of the image taking device and the printing material printed on the object is moved relative to the other of the device and the material.

(5) According to a fifth feature of the present invention that includes the fourth features (4), the inspecting step comprises separating, without moving the object and the mask relative to each other in a direction parallel to the object and the mask, at least one of the object and the mask from the other of the object and the mask in a direction perpendicular to the object and the mask, and moving the image taking device into a space produced between the object and the mask.

According to this feature, the inspection can be quickly performed without changing the relative position between the object and the mask in any directions parallel to the object and the mask.

(6) According to a sixth feature of the present invention that includes the fourth features (4), the inspecting step comprises moving at least one of the object and the mask relative to the other of the object and the mask, in a direction parallel to the object and the mask, and taking, with the image taking device, the image of the surface of the object in a state in which the mask is not present above the object.

According to this feature, the inspection can be performed in the state in which the mask is not present above the object. Thus, the inspecting step can employ an inspecting device having a simple construction, or can enjoy a high degree of freedom with which an inspecting device is disposed.

(7) According to a seventh feature of the present invention that includes the sixth feature (6), the printing step comprises printing the printing material on a plurality of portions of the objects through the mask having a plurality of through-holes formed through the thickness thereof, the inspecting step comprises inspecting the printing material printed on at least one of the plurality of portions of the object through at least a corresponding one of the plurality of through-holes of the mask, the re-printing step comprises re-printing, when the inspection shows that an amount of the printing material printed on the at least one portion of the object is short, the printing material on each of the plurality of portions of the object through a corresponding one of the plurality of through-holes of the mask, and the method further comprises a step of positioning, before starting the printing step, at least one of the object and the mask relative to the other of the object and the mask, and a step of repositioning, before starting the re-printing step, at least one of the object and the mask relative to the other of the object and the mask.

Before the printing step is started, at least one of the object and the mask is positioned relative to the other of the object and the mask in a direction parallel to the object and the mask. However, to perform the inspection, at least one of the object and the mask is moved relative to the other of the object and the mask, in the direction parallel to the object and the mask, and accordingly the object and the mask may be out of position relative to each other. Therefore, before the re-printing step is started, at least one of the object and the mask is re-positioned relative to the other of the object and the mask, so that the printing material can be accurately printed on a print spot on the object.

(8) According to an eighth feature of the present invention that includes any one of the first to seventh features (1) to (7), the printing method further comprises a step of cleaning the mask, at least when the inspection shows the shortage of the printing amount.

It is speculated that one of the causes of the shortage of the printing material is the sticking of the printing material to the inner surface of the through-hole of the mask. The shortage of the printing material that is caused by the sticking of the material can be removed by cleaning the mask and thereby removing the material stuck to the mask. However, it is possible to clean the mask at a time or times different from the time when the shortage of the printing material is found.

(9) According to a ninth feature of the present invention that includes any one of the first to eighth features (1) to (8), the inspecting step comprises inspecting the printing material for finding at least one different sort of defect than the shortage of the amount of the printing material, and identifying a particular sort of the defect found.

Since the particular sort of the found defect is identified, an operator can take appropriate countermeasures against the identified sort of defect.

(10) According to a tenth feature of the present invention that includes the ninth feature (9), the at least one different sort of defect comprises at least one of an excessive amount of the printing material printed on the object, and a printing of the printing material at an erroneous position on the object.

The mask-printing method according to any one of the first to tenth features can employ any one of the eleventh to nineteenth features that will be described below in connection with the mask-printing apparatus, and the mask-printing apparatus according to any one of the eleventh to nineteenth features can employ any one of the first to tenth features that have been described above in association with the mask-printing method.

(11) According to an eleventh feature of the present invention, there is provided a mask printing apparatus comprising an object supporting device which supports an object; a printing device which prints, through a mask having at least one through-hole formed through a thickness thereof, a printing material on the object supported by the object supporting device; an inspecting device which inspects the printing material printed on at least one portion of the object through the at least one through-hole of the mask; and a re-printing device which re-prints, when the inspecting device finds that an amount of the printing material printed on the at least one portion of the object is short, the printing material on the at least one portion of the object through the at least one through-hole of the mask to compensate for the short amount of the printing material.

The mask-printing apparatus according to the eleventh feature (11) can advantageously perform the mask-printing method according to the first feature (1).

(12) According to a twelfth feature of the present invention that includes the eleventh feature (11), the inspecting device comprises an image taking device which takes an image of the printing material printed on the object by the printing device, and a data processor which processes image data representing the image taken by the image taking device to find the shortage of the amount of the printing material.

The image taking device may be one of the various devices described above in connection with the fourth feature (4).

(13) According to a thirteenth feature of the present invention that includes the eleventh or twelfth feature (11) or (12), the printing apparatus further comprises a positioning device which automatically moves at least one of the object supporting device and the mask relative to the other of the object supporting device and the mask, in a direction parallel to the object supported by the object supporting device, and the mask, and thereby positions at least one of the object and the mask relative to the other of the object and the mask.

As will be described in DETAILED DESCRIPTION OF PREFERRED EMBODIMENTS, at least one of the object and the mask may be positioned relative to the other of the object and the mask, before the re-printing, irrespective of whether the inspection is performed at a position different from the position where the mask printing is performed, or the very position where the mask printing is performed. Since at least one of the object supporting device and the mask is positioned relative to the other of the object supporting device and the mask, the printing material can be accurately printed on a print spot on the object.

(14) According to a fourteenth feature of the present invention that includes the thirteenth feature (13), the positioning device comprises at least one image taking device which takes a first image of at least one reference mark provided on the object supported by the object supporting device, and a second image of at least one reference mark provided on the mask; and a positional-error finding device which finds, based on the first and second images taken by the image taking device, a positional error of the object and the mask relative to each other.

The image taking device which takes the first and second images may be provided by either the above-described image taking device which takes the image of the printing material, or a device different from the above-described image taking device. In addition, the at least one image taking device which takes the first and second images may be provided by respective exclusive image taking devices which takes the firs and second images, respectively; or a single, common image taking device which takes both the first and second images. In the latter case, the common image taking device may be selectively oriented in each of two opposite directions, or may be selectively used with each of two optical systems.

(15) According to a fifteenth feature of the present invention that includes any one of the eleventh to fourteenth features (11) to (14), the printing device prints the printing material on a plurality of portions of the objects through the mask having a plurality of through-holes formed through the thickness thereof, the inspecting device inspects the printing material printed on at least one of the plurality of portions of the object through at least a corresponding one of the plurality of through-holes of the mask, the re-printing device comprises the printing device and a re-printing commanding device which commands, when the inspecting device finds that an amount of the printing material printed on the at least one portion of the object is short, the printing device to reprint the printing material on each of the plurality of portions of the object through a corresponding one of the plurality of through-holes of the mask.

The mask-printing apparatus according to the fifteenth feature (15) can advantageously perform the mask-printing method according to the second feature (2).

(16) According to a sixteenth feature of the present invention that includes the fifteenth feature (15), the re-printing commanding device comprises a smaller-amount-printing commanding device which commands the printing device to re-print the printing material on the each portion of the object through the corresponding one through-hole of the mask, such that an amount of the printing material squeezed into the one through-hole for the re-printing is smaller than the amount of the printing material squeezed into the one through-hole for the printing.

The mask-printing apparatus according to the sixteenth feature (16) can advantageously perform the mask-printing method according to the third feature (3).

(17) According to a seventeenth feature of the present invention that includes any one of the eleventh to sixteenth features (11) to (16), the printing apparatus further comprises a cleaning device which automatically cleans the mask.

The cleaning device may be any one of various devices. As will be described in DETAILED DESCRIPTION OF PREFERRED EMBODIMENTS, the cleaning device may be one which cleans the mask remaining at a first position where the mask is used for the printing, without having to move the object and the mask relative to each other in a direction parallel to the object and the mask; or one which is provided at a second position away from the first position where the mask is used for the printing and which cleans the mask at the second position. In the latter case, the mask printing may be suspended while the current mask is cleaned by the cleaning device; or the mask printing may be performed by a spare mask, while the current mask is cleaned. The mask-printing apparatus according to the seventeenth feature (17) can advantageously perform the mask-printing method according to the eighth feature (8).

(18) According to an eighteenth feature of the present invention that includes the seventeenth feature (17), the printing apparatus further comprises a cleaning commanding device which commands, at least when the inspecting device finds the shortage of the amount of the printing material, the cleaning device to clean the mask.

(19) According to a nineteenth feature of the present invention that includes any one of the eleventh to eighteenth features (11) to (18), the inspecting device is provided at a position distant from the printing device in a direction parallel to the mask, and comprises a moving device which moves the object from the printing device to the inspecting device, and the printing apparatus further comprises an object returning device which returns, when the inspecting device finds the shortage of the amount of the printing material, the object to the printing device.

As will be described in DETAILED DESCRIPTION OF PREFERRED EMBODIMENTS, the object returning device may be provided by a conveying device which carries, in and carries out, the object to a position where the printing and the re-printing are performed; or a device different from the conveying device. The mask-printing apparatus according to the nineteenth feature (19) can advantageously perform the mask-printing method according to the sixth feature (6). In the case where the printing apparatus further comprises the above-described positioning device, the re-printing can be accurately performed.

BRIEF DESCRIPTION OF DRAWINGS

The above and optional objects, features, and advantages of the present invention will be better understood by reading the following detailed description of the preferred embodiments of the invention, when considered in conjunction with the accompanying drawings, in which.

DETAILED DESCRIPTION OF PREFERRED EMBODIMENTS

Figure 1:
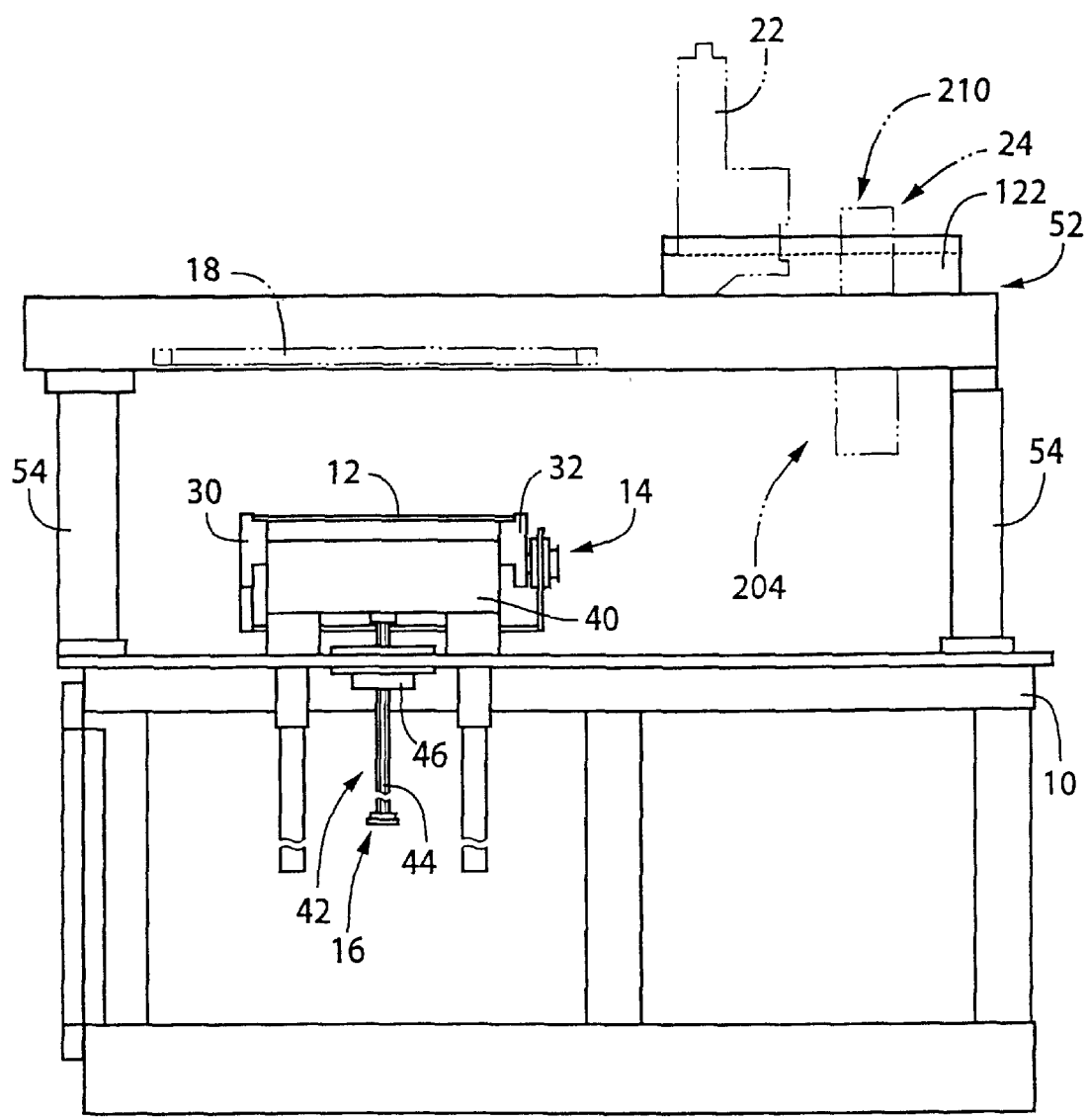
FIG. 1 is a side elevation view of a mask printing It machine embodying the present invention.

FIG. 1 schematically shows a mask-printing machine as a mask-printing apparatus embodying the present invention.

Reference numeral 10 designates a base. The base 10 supports a printed-wiring-board ("PWB") conveyor 14 as a conveying device that conveys a PWB 12 as an object on which a mask printing is to be carried out; a PWB supporting and moving device 16 as an object supporting and moving device as a sort of object supporting device that supports, and moves up and down, the PWB 12 which has been, and will be, conveyed by the PWB conveyor 14; a PWB hold-down device (not shown) which holds down the PWB 12 when the PWB supporting and moving device 16 supports the PWB 12; a mask positioning and supporting device 20 (FIG. 3) which positions and supports a mask plate 18; a printing device 22 which prints a creamed solder as a sort of printing substance or material, on the PWB 12; a mask cleaning device 24 which cleans a mask 48 of the mask plate 18; an inspecting device 26 (FIG. 8) which inspects the creamed solder printed on the PWB 12 by the printing device 22; a PWB-reference-mark imaging device 28 (FIG. 8) which takes an image of each of a plurality of reference marks affixed to the PWB 12; and a mask-reference-mark imaging device 29 (FIG. 8) which takes an image of each of a plurality of reference marks affixed to the mask 48.

Figure 3:
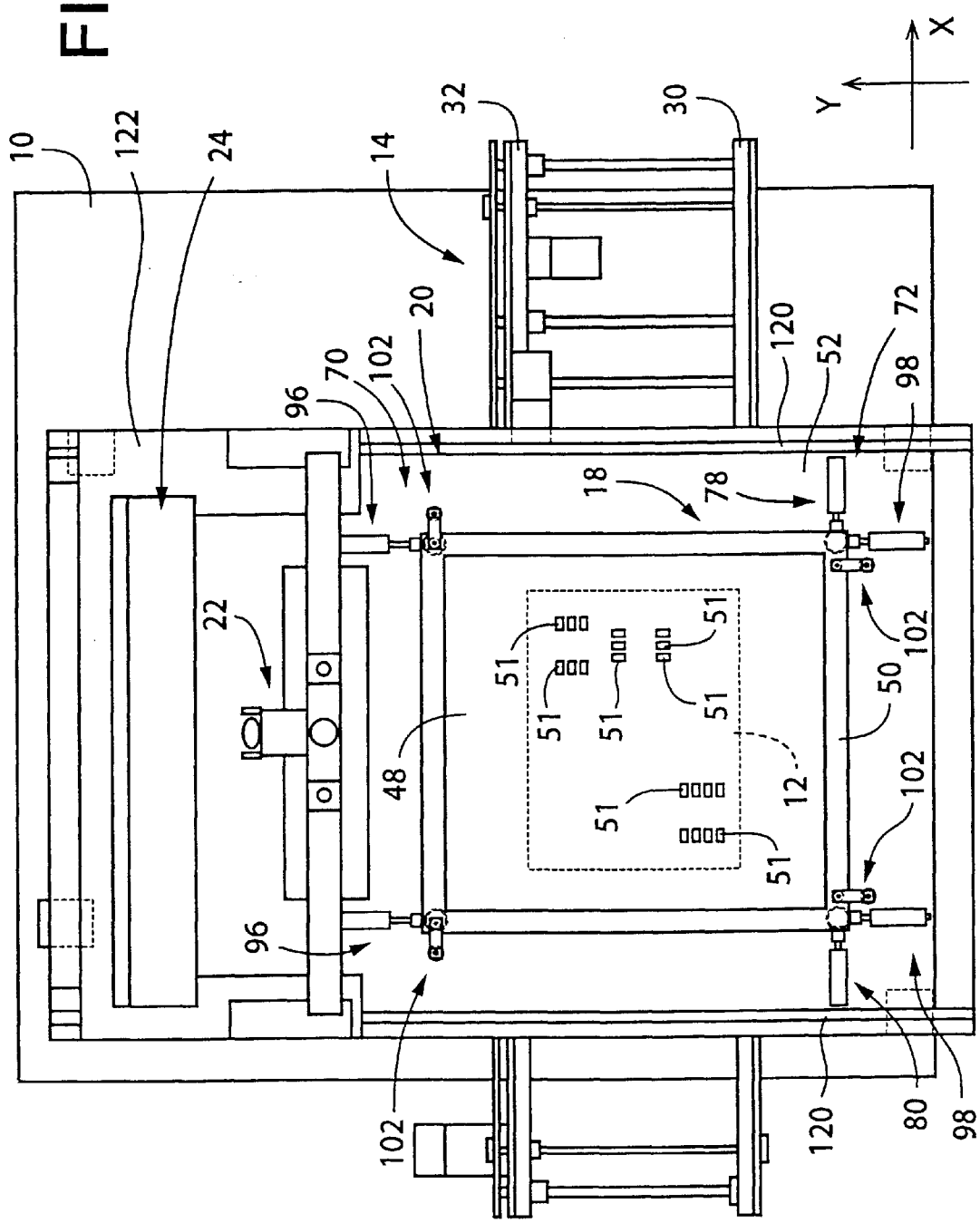
FIG. 3 is a plan view of the mask printing machine.

As shown in FIG. 3, the PWB conveyor 14 includes a stationary rail 30 which is fixed in position, and a movable rail 32 which extends parallel to the stationary rail 30 and is movable toward, and away from, the same 30. An endless belt (not shown) as a wound-on member is supported by each of the two rails 30, 32, such that the belt extends parallel to the each rail 30, 32. The PWB 12 is placed on the two belts and, when the belts are circulated by a belt drive device (not shown), the PWB 12 is conveyed. The distance between the two rails 30, 32 is adjustable by an operator according to the size of the PWB 12. A stopper device (not shown) stops the PWB 12 being conveyed in a PWB-convey direction, at a printing position where the creamed solder is printed on the PWB 12. The stopper device includes a stopper member which is movable to an operative position where the stopper member stops the movement of the PWB 12, and to an inoperative position where the stopper member allows the movement of the PWB 12. The printing position is right above a PWB supporting table 40 as an object supporting table that is a member of the PWB supporting and moving device 16.

A carry-in conveyor 34 (FIG. 10) which carries in the PWB 12 onto the PWB conveyor 14 is provided on an upstream side of the PWB conveyor 14 as seen in the PWB-convey direction, and a carry-out conveyor 36 (FIG. 10) which carries out the PWB 12 from the PWB conveyor 14 is provided on a downstream side of the PWB conveyor 14 in the PWB-convey direction. The three conveyors 14, 34, 36 cooperate with one another to provide the conveying device which conveys the PWB 12 in the PWB-convey direction which is parallel to a horizontal plane.

Figure 2:
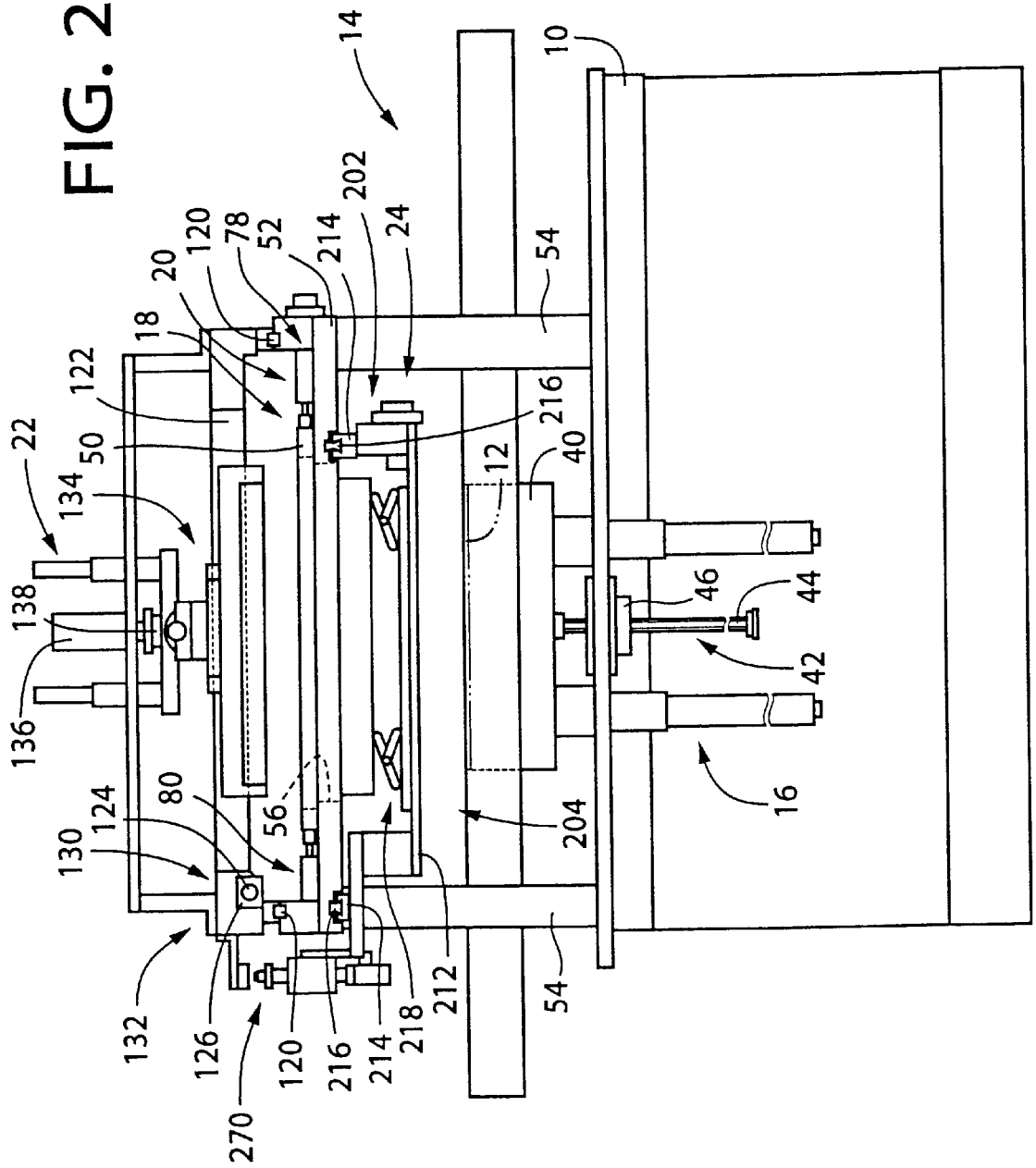
FIG. 2 is a front elevation view of the mask printing machine.

As shown in FIGS. 1 and 2, the PWB supporting and moving device 16 is provided below the printing device 22, and the PWB supporting table 40 of the device 16 is movable up and down through the space provided between the stationary and movable rails 30, 32. In the present embodiment, the table 40 applies suction or negative pressure to the PWB 12 and thereby supports the same 12 in its horizontal posture. The device 16 additionally includes an elevating and lowering device 42 which elevates the table 40 to its upper-end position where the PWB 12 supported by the table 40 is up off the two belts of the PWB conveyor 14 and contacts a lower surface of the mask 48 of the mask plate 18, and lowers the table 40 to its lower-end position where the table 40 is positioned below the PWB conveyor 14.

The elevating and lowering device 42 includes a feed screw 44 which is fixed to the PWB supporting table 40; a nut 46 which is supported by the base 10 such that the nut 46 is rotatable about a vertical axis line relative to the base 10 and is not movable in an axial direction parallel to the vertical axis line; and a servomotor (not shown) which rotates the nut 46. A servomotor is an electric rotary motor as a sort of drive source, and is accurately controllable with respect to its rotation angle or amount and its rotation speed. A servomotor may be replaced with a stepper motor. This is true with other servomotors that are employed in the present mask-printing machine, though not explicitly noted. The rotation of the servomotor is transmitted by a rotation transmitting device (not shown) to the nut 46, so that the nut 46 is rotated, the feed screw 44 is moved upward or downward, and the PWB supporting table 40 is elevated or lowered. A dimension of the table 40 as seen in a direction perpendicular to the PWB-convey direction on a horizontal plane is adjustable depending upon the width of the PWB 12.

A positioning device (not shown) which positions the PWB 12 is provided at the printing position where the movement of the PWB 12 is stopped by the stopper device. Thus, the PWB 12 which has been stopped by the stopper device is accurately positioned by the positioning device. The positioning device includes two positioning pins, each as a positioning member, at respective positions which are distant from each other in a horizontal direction parallel to the PWB 12. The two positioning pins are movable up and down, and are engageable with two positioning holes of the PWB 12, respectively. Basically, the positioning pins are kept at their lower-end positions. When the PWB supporting table 40 is elevated, a biasing device (not shown), such as a spring, biases the positioning pins and thereby moves the same upward, so that the pins engage the positioning holes of the PWB 12, respectively, and thereby position the PWB 12. In a state in which the table 40 is kept at its lower-end position, the pins are also kept at their lower-end positions, allowing the PWB conveyor 14 to convey the PWB 12.

The PWB hold-down device (not shown) is provided between the PWB conveyor 14 and the mask positioning and supporting device 20, and includes a plate-like PWB hold-down member. The hold-down member is movable to an operative position above the PWB 12 being positioned at the printing position, and to a retracted position away from above the PWB 12. The elevating and lowering device 42 moves the PWB supporting table 40 to not only its upper-end and lower-end positions but also a suction position where the table 40 is stopped to press the PWB 12 against the PWB hold-down member, apply suction to the PWB 12 and hold the same 12. When the table 40 is elevated and the PWB 12 is moved up off the belts of the PWB conveyor 14, simultaneously the positioning pins engage the positioning holes of the PWB 12, and thereby accurately position the same 12 relative to the table 40. After this positioning, the table 40 is further elevated to reach the suction position where the table 40 presses the PWB 12 against the PWB hold-down member being positioned at its operative position, and holds the PWB 12 by suction. At this moment, the pins remain engaged with the holes of the PWB 12. That is, the PWB 12 is supported by the table 40 in the state in which the PWB 12 has been positioned by the pins. As the table 40 is further elevated, the pins are disengaged from the holes of the PWB 12. That is, the creamed solder is printed on the PWB 12 held in contact with the mask 48 of the mask plate 18, in the state in which the pins have been released from the holes of the PWB 12.

As shown in FIG. 3, the mask plate 18 includes a mask frame 50 to a lower surface of which a peripheral portion of the mask 48 is fixed. In the present embodiment, the mask 48 is provided by a stencil mask which is formed of, e.g., a nickel alloy or a stainless steel. The mask 48 has a plurality of through-holes 51 which are formed through the thickness of the mask 48. In the present embodiment, each of the through-holes 51 has a rectangular (e.g., square) cross section as taken along a plane parallel to the mask frame 50. The PWB 12 has a planar surface 49 (FIG. 5) including a plurality of predetermined print spots to each of which the creamed solder is applied. The mask 48 has the plurality of through-holes 51 at respective positions corresponding to the plurality of print spots predetermined on the PWB 12. In the present embodiment, the through-holes 51 are formed in the mask 48, such that one pair of sides of the rectangular cross section of each through-hole 51 are parallel to an X-axis direction indicated at arrow in FIG. 3, and the other pair of sides of the cross section are parallel to a Y-axis direction perpendicular to the X-axis direction.

Figure 4:
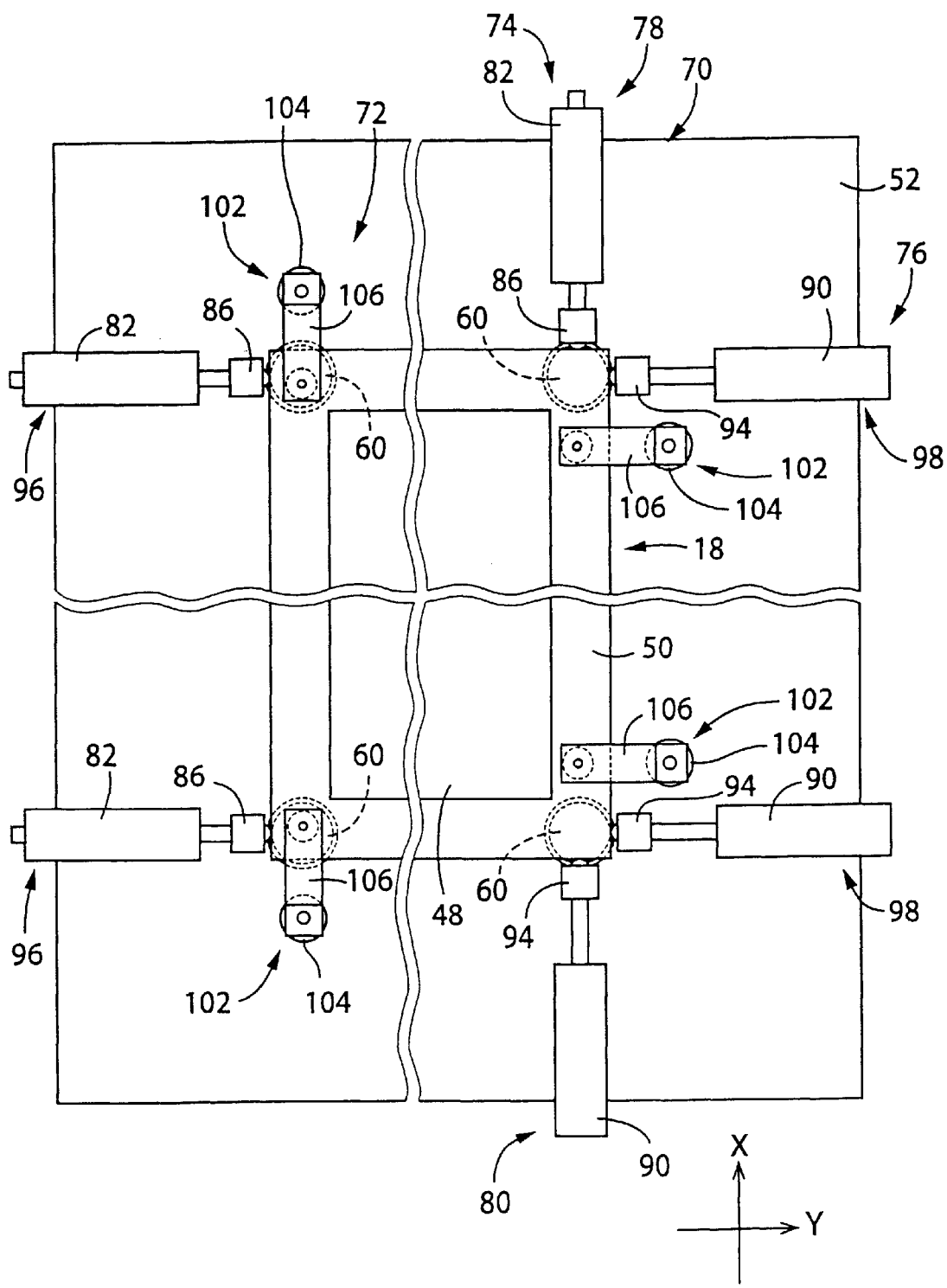
FIG. 4 is a plan view of a mask positioning and supporting device of the mask printing machine.
Figure 5:
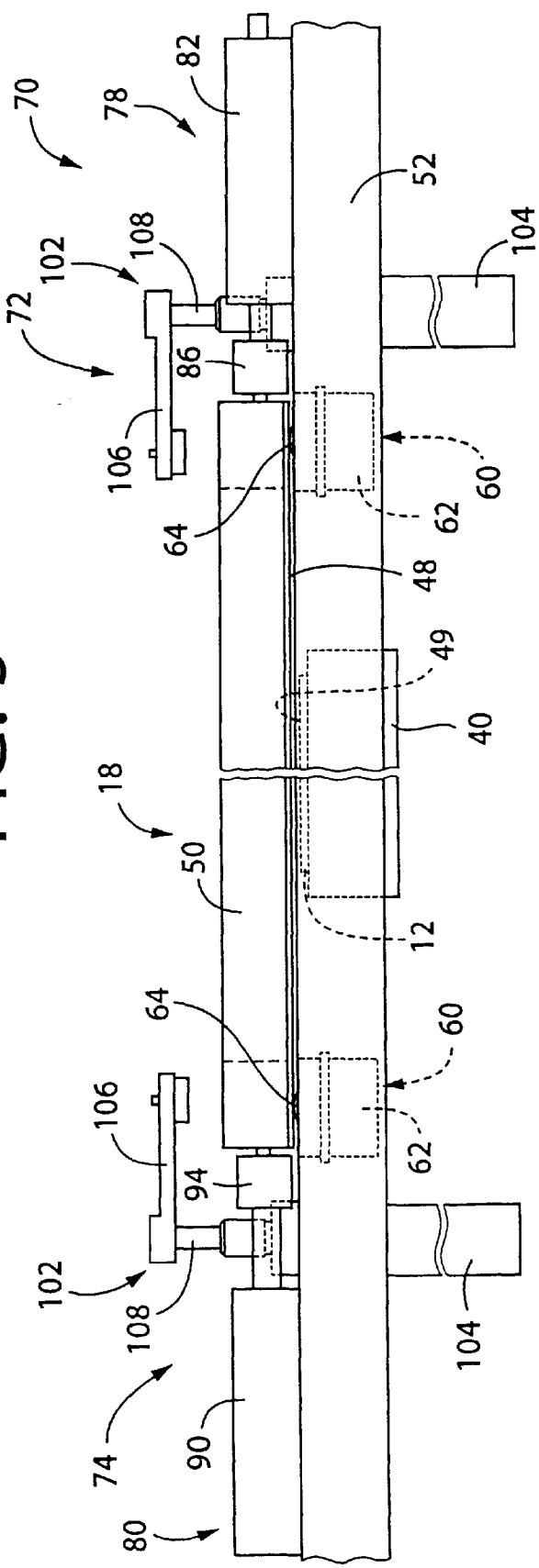
FIG. 5 is a side elevation view of the mask positioning and supporting device.

As shown in FIGS. 4 and 5, the mask positioning and supporting device 20 includes a plate-like, mask supporting table 52 which supports the mask frame 50 and which is fixed to respective upper ends of four columns 54 which stand on the base 10. As shown in FIG. 2, the table 52 has an opening 56 which is formed through the thickness of the table 52, and the mask frame 50 is supported on a solid portion of the table 50 that defines the opening 56.

As shown in FIG. 4, four ball units 60 are provided, on the mask supporting table 52, at respective positions corresponding to the four corners of the mask frame 50. The all units 60 are disclosed in U.S. Pat. No. 6,058,835 assigned to the assignee of the present application. Hence, the ball units 60 will be just briefly described below.

Each of the four ball units 60 includes a unit case 62 (FIG. 5), a ball 64 which is rotatably received in the case 62, and a spring (not shown) as an elastic member as a sort of biasing device. In a state in which the mask plate 18 is not supported on the mask supporting table 52, the respective balls 64 of the ball units 60 are biased by the respective springs to partly project upward from the respective unit cases 62, and are thus positioned at their projected positions. When the mask plate 18 is placed and supported on the table 52, the balls 64 are retracted into the cases 62 against the biasing forces of the springs, and are thus positioned at their retracted positions, allowing the mask frame 50 to indirectly contact the table 52 via the mask 48 fixed to the lower surface of the frame 50.

As shown in FIGS. 4 and 5, the mask supporting table 52 is provided with a position adjusting device 70 and a fixing device 72. The position adjusting device 70 and the fixing device 72 are disclosed in the above-identified U.S. Pat. No. 6,058,835. Hence, the two devices 70, 72 will be just briefly described below.

The position adjusting device 70 includes an X-axis-direction position adjusting device 74 which adjusts the position of the mask plate 18 relative to the mask supporting table 52 in the X-axis direction parallel to the PWB-convey direction, and a Y-axis-direction position adjusting device 76 which adjusts the position of the mask plate 18 relative to the mask supporting table 52 in the Y-axis direction perpendicular to the X-axis direction on a horizontal plane. The X-axis-direction position adjusting device 74 includes a first position adjusting device 78 and a first pressing device 80. The first positioning device 78 includes a position-adjusting cylinder device 82 which is provided by an electrically-operated cylinder device which includes a servomotor as its drive source, and a head 86 as a positioning member. The cylinder device 82 causes the head 86 to butt against the mask frame 50 and thereby position the same 50. That is, as the head 86 is moved-in the X-axis direction by the cylinder device 82, the X-axis-direction position of the mask frame 18 relative to the table 52 is automatically adjusted.

The first pressing device 80 is opposed to the first position adjusting device 78 in the X-axis direction, and includes an air-operated cylinder device ("air cylinder") 90 and a head 94 as a positioning member. An air cylinder is a pressurized-fluid-operated actuator as a drive source, and a sort of pressurized-fluid-operated cylinder device. This is true with other air cylinders which are employed in the present mask-printing machine. As the head 94 is moved by the air cylinder 90, the head 94 presses the mask frame 50 against the head 86.

The Y-axis-direction position adjusting device 76 two second position adjusting devices 96 each identical with the first position adjusting device 78, and two second pressing devices 98 each identical with the first pressing device 80. In FIG. 5, the second pressing devices 98 are omitted.

As shown in FIG. 5, the fixing device 72 includes four clamp units 102 (only two clamp units 102 are shown in FIG. 5). The four clamp units 102 are provided, on the mask supporting table 52, at respective positions substantially corresponding to the four corners of the mask frame 50. Each of the clamp units 102 includes an air cylinder 104 that is a pressurized-fluid-operated actuator as a drive source and a sort of pressurized-fluid-operated cylinder device; a cam device (not shown); and a clamp arm 106. The air cylinder 104 and the cam device cooperate with each other to move the clamp arm 106 in a vertical direction perpendicular to the table 52, while rotating the arm 106 about an axis member 108, between its clamping position where the arm 106 is positioned on the mask frame 50 to press and fix the same 50 on and to the table 52, and its retracted position away from above the table 52. The mask supporting table 52, the position adjusting device 70, the fixing device 72, etc. cooperate with one another to provide the mask positioning and supporting device 20 which can adjust the position of the mask 48 relative to the PWB 12.

Next, the printing device 22 is described. Since the printing device 22 is disclosed in Japanese Patent Application laid open under Publication No. 9-39214 and the corresponding U.S. Pat. No. 5,701,821, it will be just briefly described below.

As shown in FIG. 2, two guide rails 120 are provided on the mask supporting table 52, such that the guide rails 120 extend perpendicularly to the PWB-convey direction as an object-convey direction. A slide member 122 is fitted on the guide rails 120, such that the slide member 122 is slideable on the guide rails 120. The slide member 122 is moved by a moving device 130 in a printing direction parallel to the Y-axis direction perpendicular to the PWB-convey direction, while being guided by the guide rails 120. The moving device 130 includes a ball screw 124 which is supported by the table 52 such that the screw 124 is rotatable about a horizontal axis line and is not movable in an axial direction parallel to the axis line; a nut 126 which is fixed to the slide member 122 and is threadedly engaged with the ball screw 124; and a printing-head moving servomotor (not shown). The slide member 122 and the moving device 130 cooperate with each other to provide a printing-head moving device 132, and the two guide rails 120 provide a guide device.

Figure 6:
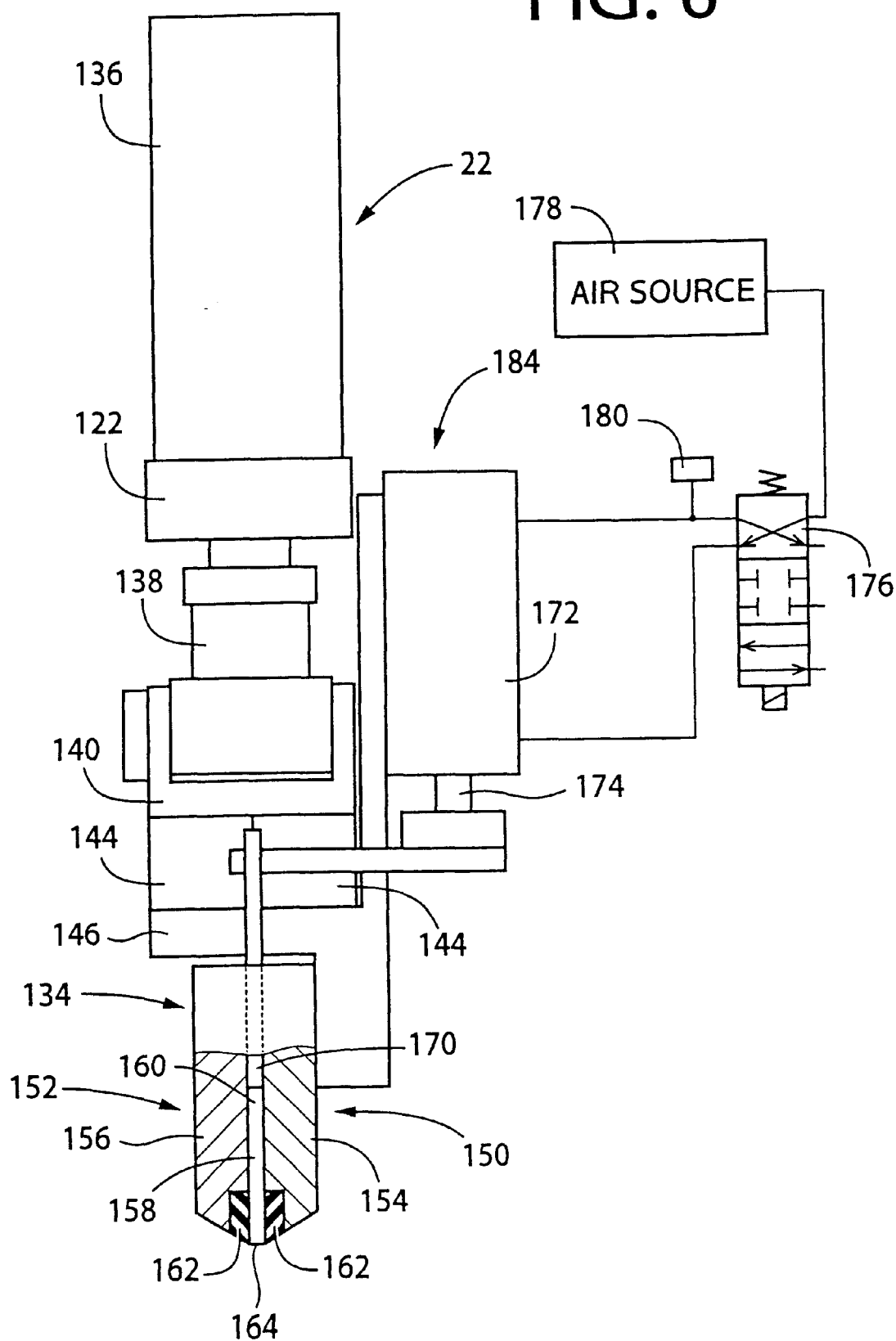
FIG. 6 is a side elevation view of a relevant portion of a printing device of the mask printing machine.

A printing head 134 is supported by the slide member 122, such that the head 134 is movable upward and downward and is pivotable about an axis line parallel to the PWB-convey direction. The printing head 134 is moved up and down by a printing-head-moving air cylinder 136 as a printing-head elevating and lowering device that is provided on the slide member 122. As shown in FIG. 6, the printing head 134 is supported by the air cylinder 136 via a contact-load adjusting air cylinder 138, a pivotable plate 140, two load sensors 144, and a support member 146. Based on respective load values detected by the two load sensors 144, the air cylinder 138 is so controlled that the head 134 contacts the mask 48 with a predetermined load.

The printing head 134 includes a solder holder 150 as a printing-material holder. The solder holder 150 includes a main body 152 which, in the present embodiment, is obtained by assembling a plurality of members. The main body 152 includes a first plate-like member 154, a second plate-like member 156, and two closure plates 158 (only one closure plate 158 is shown in FIG. 6) which are fixed to lengthwise opposite end surfaces of the first member 154, respectively. The first and second members 154, 156 are elongate in a direction perpendicular to the printing direction on a horizontal plane, i.e., a direction parallel to a widthwise direction of the mask 48 positioned and supported by the mask positioning and supporting device 20. The first and second plate-like members 154, 156 and the two closure plates 158 cooperate with each other to a solder-hold chamber 160 as a printing-material-hold chamber that is elongate in the widthwise direction of the mask 48 and holds the creamed solder. Two plate-like outlet-forming members 162 each formed of rubber are detachably attached to the two plate-like members 152, 154, respectively. The outlet-forming members 162 are elongate in the widthwise direction of the mask 48, and respective lower ends of the two members 162 cooperate with each other to form a solder outlet 164 as a printing-material outlet that communicates with the solder-hold chamber 160.

A thrusting plate 170 as a thrusting member is provided between the first and second plate-like members 154, 156, such that the plate 170 is vertically movable, i.e., movable toward, and away from, the solder outlet 164. The thrusting plate 170 is detachably attached to a piston rod 174 of a solder-thrusting air cylinder 172 that is supported by the support member 146, is a sort of pressurized-fluid-operated actuator, and provides a thrusting-member moving device. As the piston rod 174 is extended and retracted, the plate 170 is moved down and up, respectively. The air cylinder 172 is a double-action-type air cylinder having two air chambers and, as shown in FIG. 6, a solenoid-operated direction-switch valve 176 selectively places the air cylinder 172 in a first state in which a first one of the two air chambers is communicated with an air source 178 and the other, second air chamber is communicated with the atmosphere, a second state in which the first air chamber is communicated with the atmosphere and the second air chamber is communicated with the air source 178, and a third state in which the two air chambers are not communicated with the air source 178 or the atmosphere and the respective pressures in the two air chambers are held. A pressure sensor 180 detects the pressure in the upper one of the two air chambers of the air cylinder 172 that is used to move the thrusting plate 170 toward the solder outlet 164, and a control device 182 (FIG. 10) switches, based on the detected pressure, the direction-switch valve 176 among the above-described three states. Thus, the air pressure in the upper air chamber is so controlled that the thrusting plate 170 thrusts, with a prescribed thrusting pressure, the creamed solder held in the solder-hold chamber 160, so that the creamed solder is squeezed with a prescribed squeezing force, into the through-holes 51 of the mask 48. The thrusting plate 170 and the air cylinder 172 cooperate with each other to provide a solder-thrusting device 184. The thrusting plate 170 also functions as a solder-squeezing plate, and cooperates with the solder-thrusting air cylinder 172 which also functions as a solder-squeezing air cylinder, to provide a solder-squeezing device which squeezes the creamed solder into the through-holes 51.

Next, the mask cleaning device 24 is described. However, since the mask cleaning device 24 is disclosed in the above-indicated Japanese Patent document No. 9-39214, the device 24 will be briefly described below.

Figure 7:
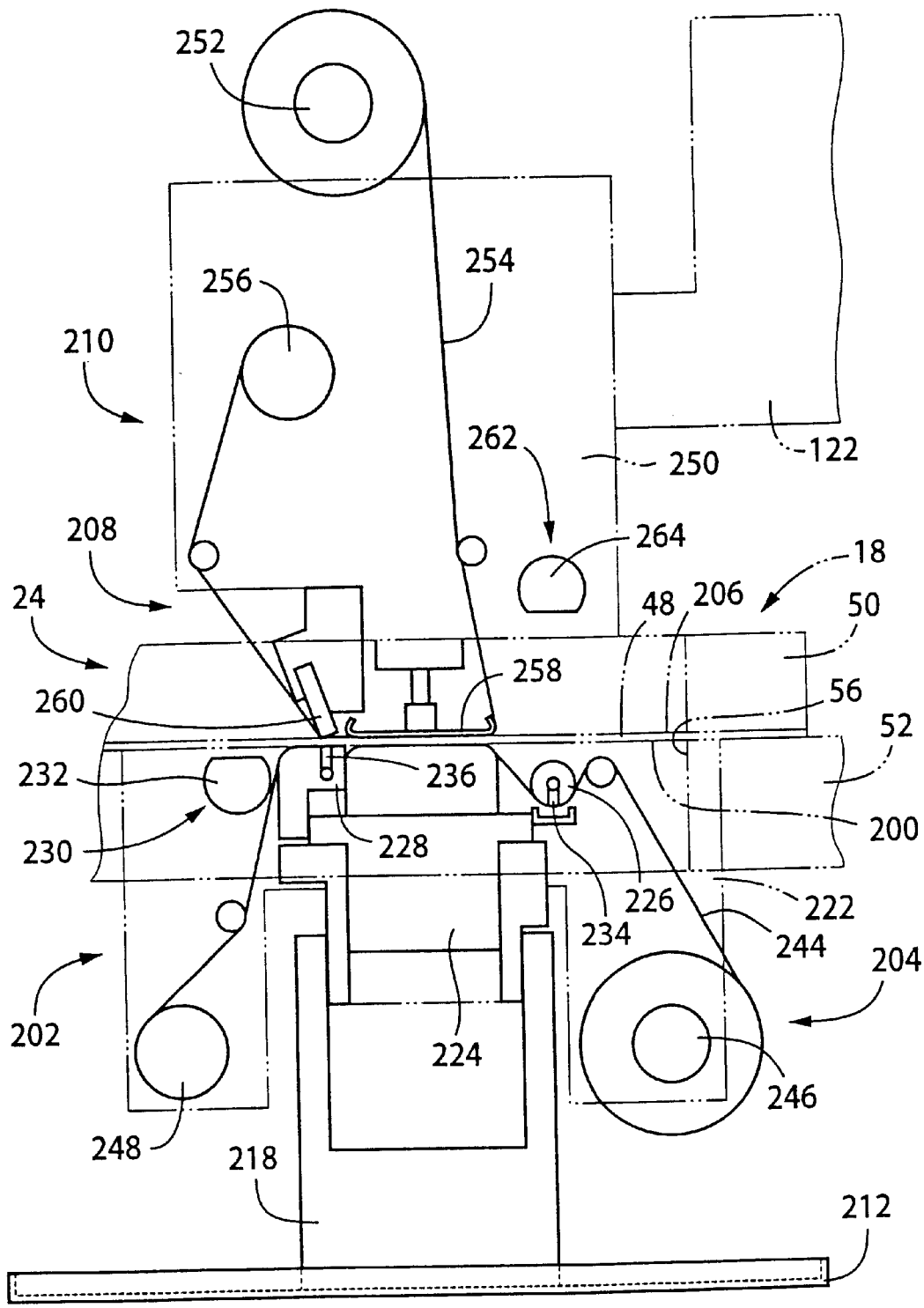
FIG. 7 is a schematic side elevation view of a mask cleaning device of the mask printing machine.

As shown in FIGS. 1 and 7, the mask cleaning device 24 includes a cleaning device 204 including a cleaning head 202 which is provided on the side of the lower surface of the mask 48, i.e., a PWB-contact surface 200 which is contacted with the PWB 12. The mask cleaning device 24 additionally includes a wiping device 210 including a wiping head 208 which is provided on the side of the upper surface of the mask 48, i.e., a solder-squeeze surface 206 as a printing-material-squeeze surface through which the creamed solder is squeezed into the through-holes 51 of the mask 48.

The cleaning device 204 includes a shallow-container-like palette 212 which is elongate in the widthwise direction of the mask 48. As shown in FIG. 2, a pair of guide blocks 214 are provided at each of lengthwise end portions of the palette 212, and the two pairs of guide blocks 214 are slideably fitted on two guide rails 216, respectively, which are provided on the lower surface of the mask supporting table 52 such that the guide rails 216 extend parallel to the printing direction. That is, the cleaning device 204 is provided under the table 52 or the mask 48 such that the device 204 is movable relative to the mask 48. The guide rails 216 provide a guide device. Between the mask supporting table 52 and the PWB-hold-down device, there is provided such a space which has a height allowing the cleaning head 202 to enter the space and move around in the space.

The cleaning head 202 is provided on the palette 212 such that the head 202 can be elevated and lowered, and is elevated and lowered by an elevating and lowering device 218. The cleaning head 202 includes a support member 222 which supports, as shown in FIG. 7, an ultrasonic vibrator 224, two detergent jetting members 226, 228, and an air jetting member 232 of a cleaning-sheet drying device 230. The detergent jetting members 226, 228 are elongate in the widthwise direction of the mask 48, are supplied with a detergent from a detergent supplying device (not shown), and jet the detergent from respective detergent outlets 234, 236. The air jetting member 232 has a cylindrical shape, extends parallel to the widthwise direction of the mask 48, is communicated with an air supplying source (not shown), and jets air through an air outlet in an upward direction toward the mask 48.

A cleaning sheet 244 is provided on the ultrasonic vibrator 224 and the detergent jetting member 228. The cleaning sheet 244 is provided by a web or roll of paper which has a belt-like shape having a width substantially equal to the width of the mask 48 (more precisely, equal to the width of the central opening of the mask frame 50), which is porous and hygroscopic, and which is wound on a supply roll 246. The cleaning sheet 244 which has been drawn from the supply roll 246 is passed under the first detergent jetting member 226 and, thereafter, is moved on the ultrasonic vibrator 224 and the second detergent jetting member 228. Then, the cleaning sheet 244 is passed between the second detergent jetting member 228 and the air jetting member 232, and is taken up by a take-up roll 248. A portion of the cleaning sheet 224 which is located at a cleaning position on the ultrasonic vibrator 224 and the second detergent jetting member 228, provides a cleaning surface which contacts and cleans the PWB-contact surface 200 of the mask 48.

When the cleaning head 202 is elevated and lowered by the elevating and lowering device 218, the cleaning sheet 244 is caused to contact, and move away from, the PWB-contact surface 200 of the mask 48. Thus, the elevating and lowering device 218 provides a device which causes the cleaning sheet 244 to contact, and move away from, the PWB-contact surface 200. The cleaning sheet 244 is fed at a predetermined pitch by a cleaning-sheet feeding device (not shown) which is supported by the support member 222. The supply roll 246, the take-up roll 248, the ultrasonic vibrator 224, the detergent jetting members 226, 228, the air jetting member 232, and the cleaning-sheet feeding device cooperate with one another to provide the cleaning head 202.

Next, the wiping device 210 is described.

The slide member 122 of the printing device 22 supports an elevator member 250 such that the elevator member 250 can be elevated and lowered by an elevating and lowering device (not shown). The elevator member 250 supports a supply roll 252 such that the supply roll 252 is rotatable about a horizontal axis line parallel to the widthwise direction of the mask 48. A piping sheet 254 is wound on the supply roll 252. The wiping sheet 254 has a belt-like shape whose width is substantially equal to the width of the mask 48 (more precisely, equal to the width of the central opening of the mask frame 50), and is provided by a porous and hygroscopic sheet of paper. The wiping sheet 254 is taken up by a take-up roll 256. The wiping sheet 254 is fed at a predetermined pitch by a wiping-sheet feeding device (not shown). The wiping sheet 254 is held down by a wiping-sheet hold-down member 258, so that a portion of the wiping sheet 254 defines a wiping surface parallel to the mask 48.

The elevator member 250 additionally supports a rubber-formed, creamed-solder scraper 260, and an air jetting member 264 of a wiping-sheet drying device 262. Each of the creamed-solder scraper 260 and the air jetting member 264 is elongate and extends parallel to the widthwise direction of the mask 48. The air jetting member 264 is supplied with air from an air supplying device (not shown) and jets the air in a downward direction.

Thus, the elevator member 250 supports the supply roll 252, the take-up roll 256, the wiping-sheet feeding device, the piping-sheet hold-down member 258, the creamed-solder scraper 260, and the air jetting member 264 all of which cooperate with one another to provide the wiping head 208. That is, the wiping head 208 is supported by the elevator member 250, and is provided on an upper side of the mask 48 and, when the slide member 122 is moved, the head 208 is moved in the same direction as the printing direction.

When the elevator member 250 is lowered and elevated, the wiping head 208 is also lowered and elevated, so that the wiping sheet 254 is caused to contact, and move away from, the mask 48. The elevator member 250 and the elevator-member elevating and lowering device cooperate with each other to provide a wiping-head elevating and lowering device, or a device which causes the wiping sheet 254 to contact, and move away from, the mask 48.

The cleaning head 202 and the wiping head 208 are connected to each other via the slide member 122 by a connecting device 270, schematically shown in FIG. 2. The connecting device 270 connects the cleaning head 202 to the slide member 122 and simultaneously disengages the head 202 from the mask support table 52, or disengages the head 202 from the slide member 202 and simultaneously connects the head 202 to the mask support table 52. The connecting device 270 carries out all the connecting and disengaging operations at a retracted position away from the mask 48.

Figure 8:
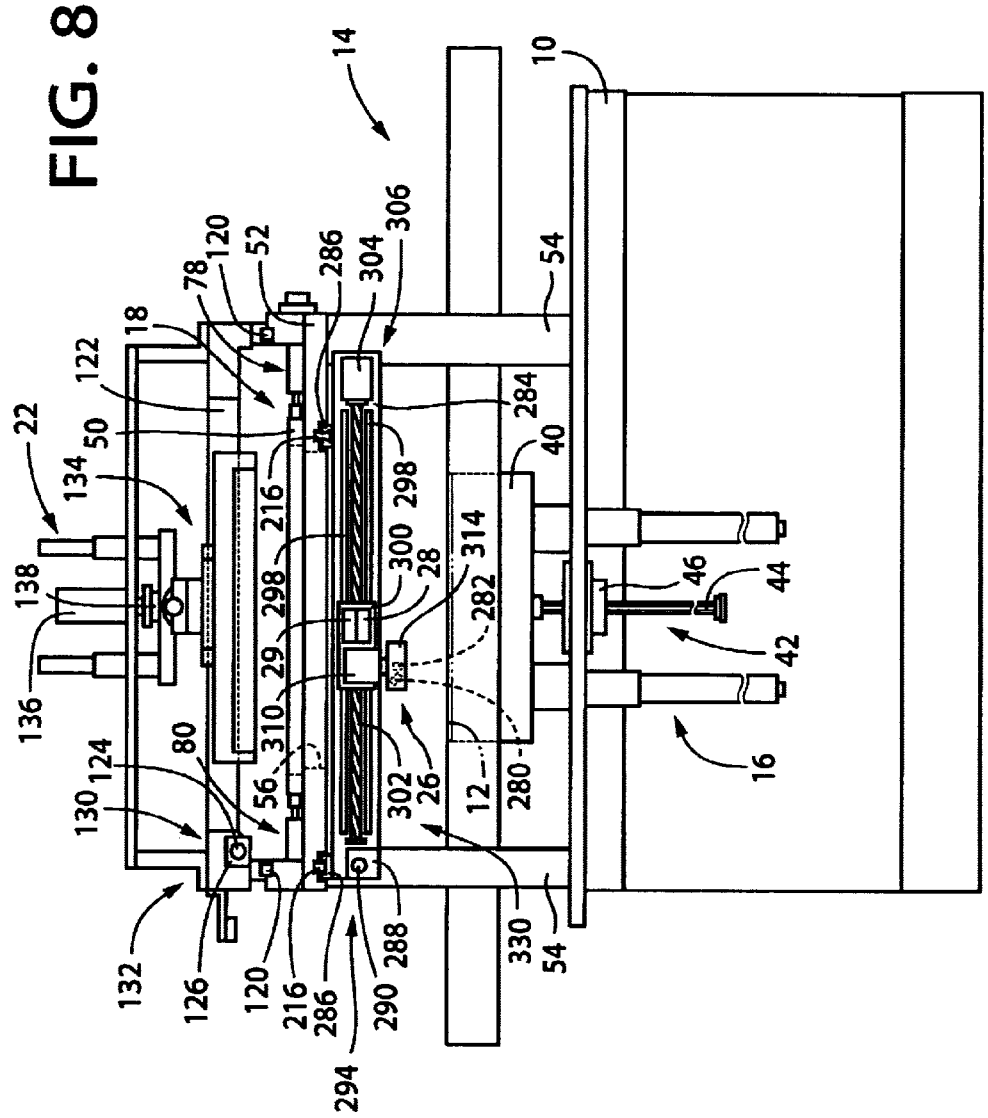
FIG. 8 is a front elevation view of an inspecting device of the mask printing machine.

Next, the inspecting device 26 is described. The inspecting device 26 includes, as shown in FIG. 8, a planar-light source 280 and a two-dimensional-image taking device 282 which are moved to an arbitrary position in a direction parallel to the horizontal, upper surface 49 of the PWB 12, so that the inspecting device 26 inspects the creamed solder printed on the PWB 12. To this end, a Y-axis slide member 284 is movably fitted via guide blocks 286 on the two guide rails 216 which guide the movement of the cleaning head 202 of the mask cleaning device 24. That is, the guide rails 216 are commonly used by the mask cleaning device 24 and the reamed-solder inspecting device 26.

A nut 288 is fixed to the Y-axis slide member 284, and is threadedly engaged with a ball screw 290 which is supported by the mask support table 52 such that the screw 290 is rotatable about a horizontal axis line and is not movable in an axial direction parallel to the axis line. When the ball screw 290 is rotated by a Y-axis servomotor 292 (FIG. 10) as a drive source, the Y-axis slide member 284 is moved by being guided by the guide rails 216. Thus, the guide rails 216 and the guide blocks 286 cooperate with one another to provide a guide device; and the nut 288, the ball screw 290, and the Y-axis servomotor 292 cooperate with one another to provide a Y-axis-slide-member moving device 294.

The Y-axis slide member 284 has a vertical side surface which supports a pair of guide rails 298 which extend parallel to the X-axis direction, and an X-axis slide member 300 is movably fitted on the guide rails 298. A nut (not shown) is fixed to the X-axis slide member 300, and is threadedly engaged with a ball screw 302 which is supported by the Y-axis slide member 284 such that the screw 302 is rotatable about a horizontal axis line and is not movable in an axial direction parallel to the axis line. When the ball screw 302 is rotated by an X-axis servomotor 304, the X-axis slide member 300 is moved by being guided by the guide rails 298.

Thus, the guide rails 298 provide a guide device; and the nut (not shown), the ball screw 302, and the X-axis servomotor 304 cooperate with one another to provide an X-axis-slide-member moving device 306.

The X-axis slide member 300 supports a holder-rotating air-operated cylinder device 310 as a holder rotating device. The air cylinder 310 is oriented in a vertical direction perpendicular to the upper surface 49 of the PWB 12, and includes a rotatable axis member 312 which is rotatable about a vertical axis line within a prescribed range of 90 degrees which is defined by one or two stoppers (not shown). The axis member 312 extends downward from the X-axis slide member 300, and supports, at its lower end thereof, a holder 314. The holder 314 is moved, by the Y-axis-slide-member and X-axis-slide-member moving devices 294, 306, to an arbitrary position on a horizontal plane, and is rotated about the vertical axis line within the range of 90 degrees by the air cylinder 310.

Figure 9:
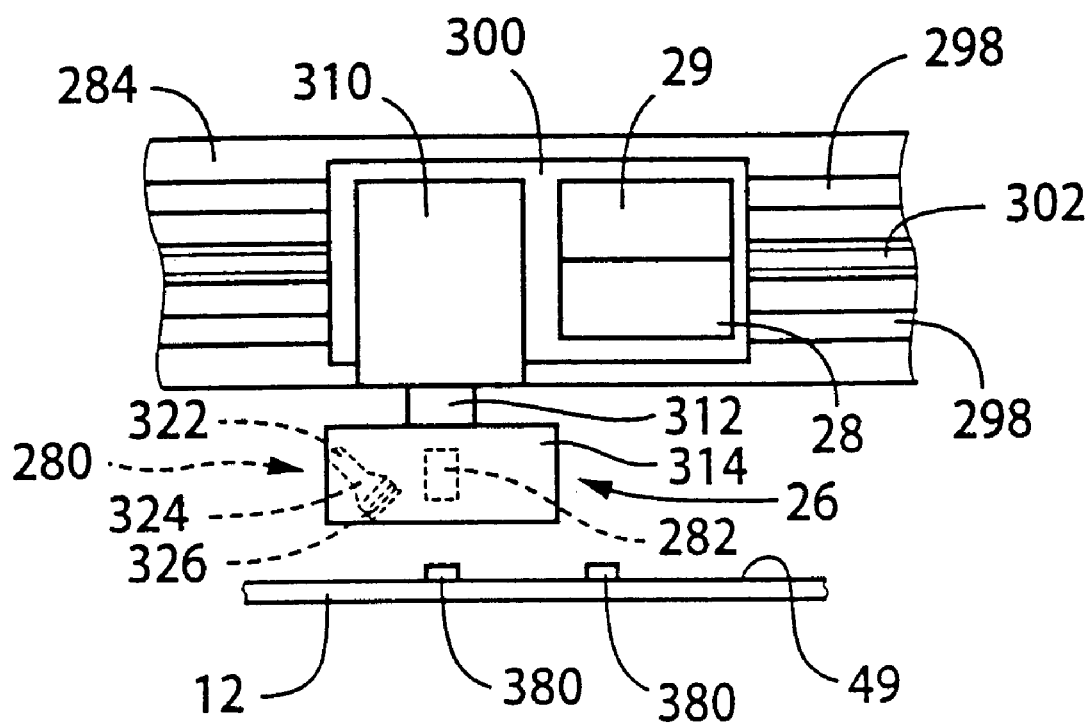
FIG. 9 is a front elevation view of a light source and a two-dimensional-image taking device of the inspecting device.

As shown in FIG. 9, the holder 314 holds the planar-light source 280 and the two-dimensional-image taking device 282. In the present embodiment, the planar-light source 280 includes a semi-conductor laser device 322; a beam expander 324 which expands the diameter of a light beam emitted by the laser device 322 and converts the expanded light beam into a flux of parallel lights having a circular cross section; and a slit plate 326 which has an elongate, straight slit and converts the parallel lights into a planar light as seen in a direction perpendicular to the slit and the direction of propagation of the light. Various sorts of slit plates 326 whose slits have different lengths may be prepared and may be selectively used. In the latter case, the planar-light source 280 can emit various sorts of planar lights whose transverse cross sections have different lengths. The planar light may be emitted by any other sort of device which is known to be able to emit a planar light, such as a cylindrical lens, an aspherical lens, or a combination of those lenses.

In the present embodiment, the two-dimensional-image taking device 282 is provided by a CCD (charge-coupled devices) camera having a two-dimensional image-take surface 328 (FIG. 14) on which an image is formed. The CCD camera includes CCDs (charge-coupled devices) each as a sort of solid image sensor, and a lens system including an image-forming lens which forms a two-dimensional image on the image-take surface 328 provided by the CCDs. The CCDs are a number of small light-sensing elements arranged on a plane, and the CCD camera 282 generates respective electric signals representing the light amounts or intensities detected by the light sensing elements, i.e., the CCDs. Those electric signals provide a batch of image data representing the two-dimensional image which is formed on the image-take surface 328 and which includes a number of picture elements or pixels corresponding to the number of CCDs, respectively.

The holder 314 holds the planar-light source 280 and the two-dimensional-image taking device 282 such that the light source 280 and the image taking device 282 keep a prescribed relative position therebetween where an optical axis of the light source 280 is inclined by 45 degrees relative to a perpendicular to the horizontal, upper surface 49 of the PWB 12, an optical axis of the image taking device 282 is perpendicular to the upper surface 49 of the PWB 12, i.e., parallel to the perpendicular to the upper surface 49, and those two optical axes intersect each other. The optical axis of the image taking device 282 is perpendicular to the upper surface 49 of the PWB 12, and accordingly is angled by 0 angle relative to the perpendicular to the upper surface 49. Therefore, the holder 314 holds the light source 280 and the image taking device 282 such that the respective optical axes of the light source 280 and the image taking device 282 are angled by different angles relative to the perpendicular to the upper surface 49 of the PWB 12. In addition, in the present embodiment, the holder 314 holds the light source 280 and the image taking device 282 such that the respective optical axes of the light source 280 and the image taking device 282 intersect each other at a center of a cross section of a creamed solder 380 printed on the surface 49 of the PWB 12 sucked and held by the PWB support table 40 being positioned at the sucking position, the cross section being taken along a plane inclined by 45 degrees relative to the surface 49. The space provided between the mask support table 52 and the PWB hold-down device has such a height which allows the light source 280 and the image taking device 282 to enter the space. Thus, the light source 280 and the image taking device 282 enter the space provided between the mask support table 52 and the PWB 12 sucked and held by the PWB support table 40 being positioned at the sucking position, and take a two-dimensional image of the creamed solder 380 printed on the surface 49 of the PWB 12 held by the table 40.

When the holder 314 is moved by the X-axis-slide-member and Y-axis-slide-member moving devices 306, 294, the light source 280 and the image taking device 282 are moved to an arbitrary position on a horizontal plane; and when the holder 314 is rotated about the vertical axis line by the holder-rotating air cylinder 310, the two elements 280, 282 are rotated within the prescribed range of 90 degrees. Since the two elements 280, 282 are both held by the holder 314 and are moved and rotated as a unit when the holder 314 is moved and rotated, the two elements 280, 282 keep their relative position even if the holder 314 is moved and/and rotated. The two elements 280, 282 can be selectively positioned, by the rotation of the holder 314, at each of two positions where a vertical plane which contains the respective optical axes of the two elements 280, 282 and is perpendicular to the surface 49 of the PWB 12 is parallel to the X-axis and Y-axis directions, respectively. Thus, the holder 314 provides a supporting device or member which supports the planar-light source 280 and the two-dimensional-image taking device 282; and the X-axis slide member 300, the X-axis-slide-member moving device 306, the Y-axis slide member 284, and the Y-axis-slide-member moving device 294 cooperate with one another to provide a holder moving device 330 as a supporting-device moving device.

As described previously, the movement of the Y-axis slide member 284 is guided by the guide rails 216 which are for guiding the movement of the cleaning head 202. Accordingly, like the cleaning head 202, the planar-light source 280 and the two-dimensional-image taking device 282 are moved in the space provided between the mask support table 52 and the PWB hold-down device. However, the cleaning head 202, and the holder 314 holding the two elements 280, 282 are retracted to respective retracted positions which are opposite to each other. Thus, the cleaning head 202 does not interfere with the image taking operation of the two elements 280, 282, and the two elements 280, 282 do not interfere with the cleaning operation of the cleaning head 202.

Next, the PWB-reference-mark-image taking device 28 and the mask-reference-mark-image taking device 29 are described by reference to FIG. 9. In the present embodiment, each of the two image taking devices 28, 29 is provided by a CCD camera having a two-dimensional image-take surface, and is associated with a lighting device (not shown). The mask-reference-mark-image taking device 29 is supported by the X-axis slide member 300, such that the device 29 is oriented in an upward direction toward the mask 48; and the PWB-reference-mark-image taking device 28 is supported by the slide member 300, such that the device 28 is oriented in a downward direction toward the PWB 12. Each of the PWB 12 and the mask 48 has a plurality of (e.g., two) reference marks located on a diagonal line thereof. The two image taking devices 28, 29 are moved, by the holder moving device 330, to an arbitrary position on a horizontal plane, so that the first device 28 takes a two-dimensional image of the reference marks provided on the PWB 12 and the second device 29 takes a two-dimensional image of the reference marks provided on the mask 48. Thus, the holder moving device 330 also functions as a reference-mark-image-taking-device moving device. The two mark-image taking devices 28, 29 are moved with the light source 280 and the creamed-solder-image taking device 282, to their retracted position. The space provided between the mask support table 52 and the PWB hold-down device allows the movement of the two mark-image taking devices 28, 29 as well as the two elements 280, 282. However, each of the two image taking devices 28, 29 may be provided by a so-called line sensor which takes a linear image each time an object or the sensor itself is moved at a predetermined pitch.

Figure 10:
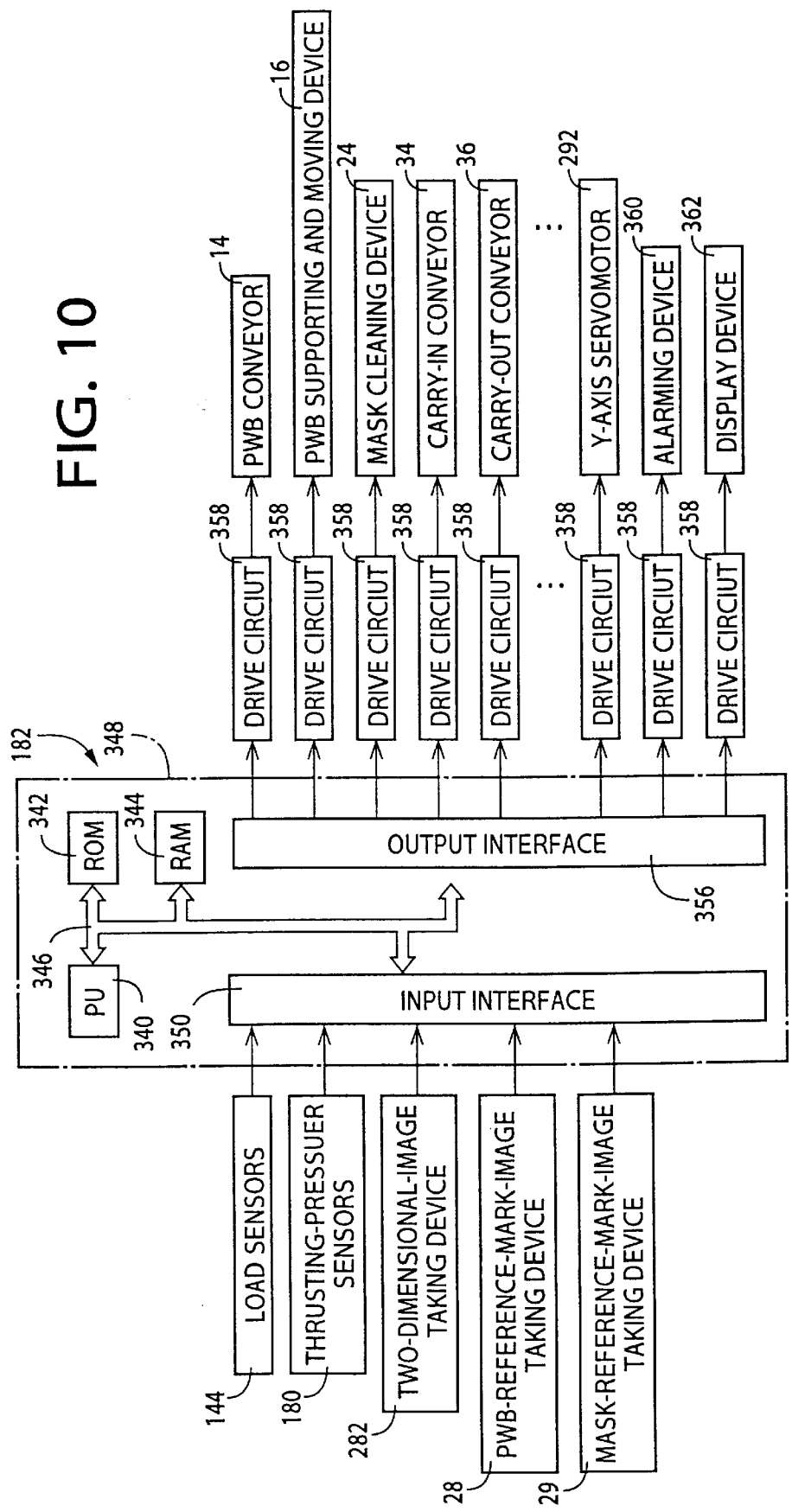
FIG. 10 is a diagrammatic view of a control device of the mask printing machine.
Figure 11:
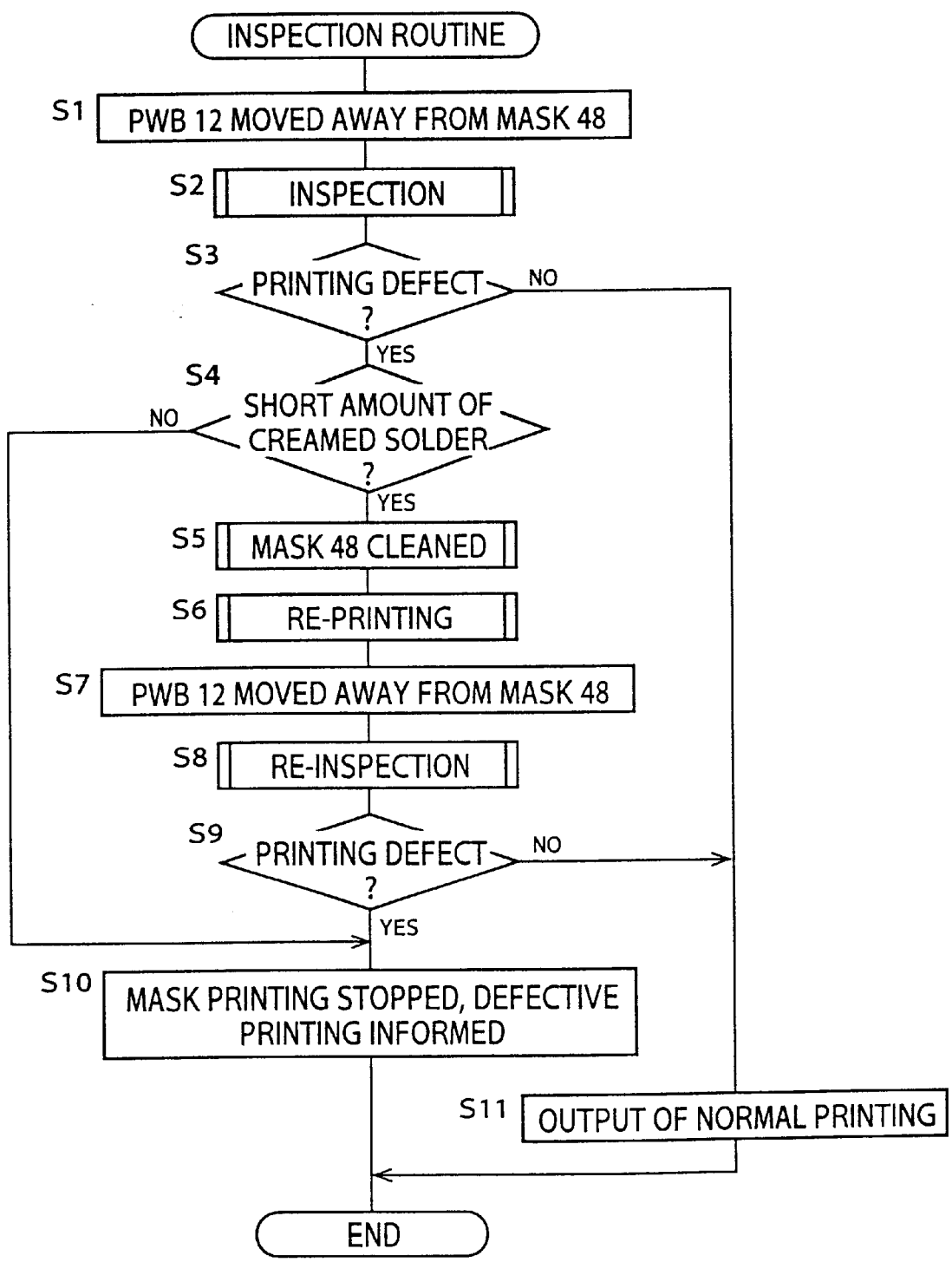
FIG. 11 is a flow chart representing an inspection routine which is stored in a read only memory ("ROM") of a computer as part of the control device.
Figure 12:
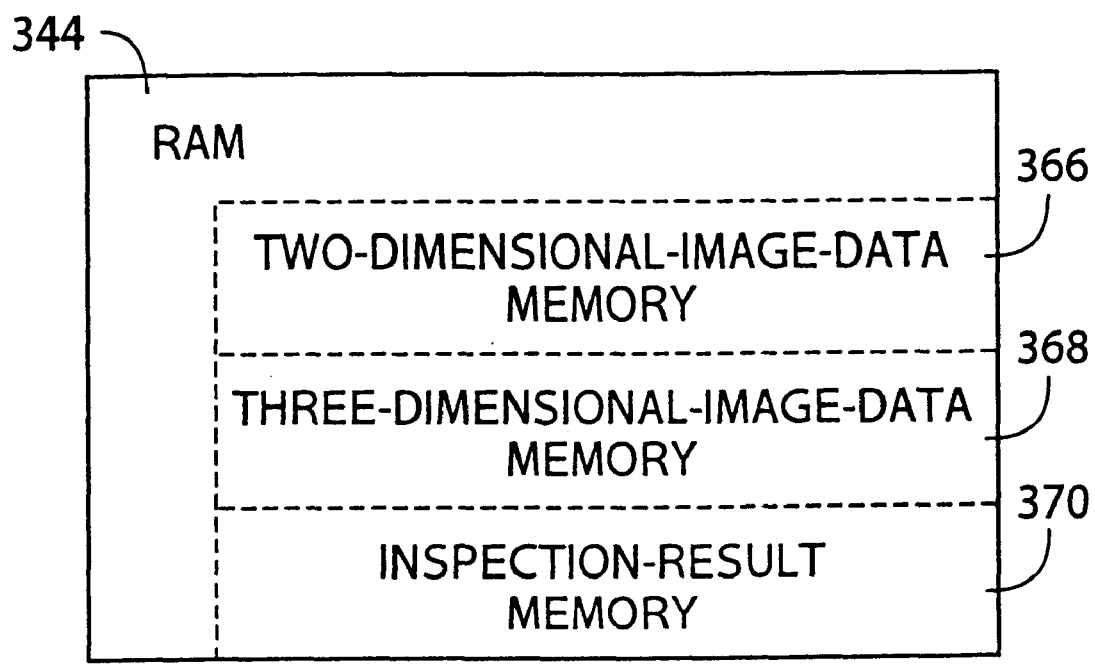
FIG. 12 is a view of a relevant portion of a random access memory ("RAM") of the computer.

The present mask printing machine is controlled by the control device 182 shown in FIG. 10. The control device 182 is essentially provided by a computer 348 including a processing unit (PU) 340, a read only memory (ROM) 342, a random access memory (RAM) 344, and a bus 346 connecting those elements 340, 342, 344 to one another. The bus 346 is also connected to an input interface 350 to which various sensors including the load sensors 144 and various image taking devices including the two-dimensional-image taking device 282. The bus 346 is also connected to an output interface 356 which is connected via respective drive circuits 358 to respective actuators of various devices including the PWB conveyor 14, and additionally to an alarming device 360 and a display device 362. The ROM 342 stores various control programs or routines including an inspection routine represented by the flow chart shown in FIG. 11. The RAM 344 includes, as shown in FIG. 12, a two-dimensional-image-data memory 366, a three-dimensional-image-data memory 368, and an inspection-result memory 370, in addition to a working memory (not shown).

Hereinafter, there will be described the operation of the present mask printing machine constructed as described above.

Before the printing of the creamed solder onto the PWB 12 is started, the mask plate 18 is fixed to the mask support table 52. Simultaneously, the positions of the mask 48 relative to the mask support table 52 in directions parallel to the mask 48 are adjusted and accordingly the positions of the mask 48 relative to the PWB elevating and lowering device 16 and the PWB 12 are adjusted. This adjustment is carried out as follows: First, the reference-mark-image taking devices 28, 29 take respective images of the reference marks provided on the PWB 12 and the mask 48; second, respective X-axis-direction and Y-axis-direction positional errors of the mask 48 relative to the PWB 12; and, third, the mask plate 18 is moved relative to the mask support table 52 in the X-axis and Y-axis directions parallel to the mask 48 to correct the positional errors. In the present embodiment, it is made a general rule to adjust the position of a mask plate 18 a single time when the mask plate 18 is initially fixed to the mask support table 52 before creamed solder is printed on the initial or first one of a plurality of PWBs 12 for which the mask plate 18 is to be repeatedly used. Therefore, the positioning holes of each PWB 12 and the positioning pins which engage the positioning holes, respectively, are so formed as to position the each PWB 12 with high accuracy. However, it is possible to adopt such a rule that before creamed solder is printed on each of a plurality of PWBs 12, the position of the mask 48 relative to the each PWB 12 is adjusted based on respective taken images of the reference marks provided on the each PWB 12 and the mask 48. In the latter case, the accuracy with which the positioning holes of each PWB 12 and the positioning pins are formed may be lower than that needed in the above-indicated case where the position of the mask 48 is adjusted a single time for a plurality of PWBs 12.

The manner in which the relative position between the mask support table 52 and the mask plate 18 is adjusted is disclosed in the previously-identified U.S. Pat. No. 6,058, 835. Hence, this manner is brief described below.

The relative position of the mask support table 52 and the mask plate 18 is adjusted as follows: The PWB 12 is supported by the PWB supporting and moving device 16, and is positioned at a position away from the mask plate 18. The PWB 12 is positioned, and is sucked and held by the PWB support table 40, and the table 40 is positioned at the sucking position where the PWB 12 is off the PWB conveyor 14 and away from the mask plate 18. The mask plate 18 which had been placed by an operator on the mask support table 52 via the balls 64 of the ball units 60, is not fixed by the fixing device 72 but is pressed by the X-axis-direction pressing device 80 and the Y-axis-direction pressing devices 98, so that the mask plate 18 is positioned at X-axis-direction and Y-axis-direction positions defined by the X-axis-direction-position adjusting device 78 and the Y-axis-direction-position adjusting device 96.

Then, the two reference-mark-image taking devices 28, 29 are moved by the holder moving device 330, to enter the space between the PWB 12 and the mask plate 18, so that the device 28 takes an image of the reference marks provided on the PWB 12 and the device 29 takes an image of the reference marks provided on the mask 48. Based on batches of image data representing the taken images, the control device 182 calculates X-axis-direction and Y-axis-direction positional errors of the mask plate 18 relative to the PWB 12, and calculates correct X-axis-direction and Y-axis-direction positions where the mask plate 18 is to be fixed without any positional errors to the mask support table 52, i.e., where the mask plate 18 is to be positioned by the X-axis-direction-position adjusting device 78 and the Y-axis-direction-position adjusting device 96.

Subsequently, the heads 86 of the two adjusting devices 78, 96 move the mask plate 18 relative to the PWB 12 supported by the PWB supporting and moving device 16, to the above-indicated correct X-axis-direction and Y-axis-direction positions. The X-axis-direction pressing device 80 and the Y-axis-direction pressing devices 98 continue pressing the mask plate 18, while the X-axis-direction-position adjusting device 78 and the Y-axis-direction-position adjusting device 96 move the mask plate 18 for adjusting the respective positions of the plate 18 relative to the mask support table 52. While the positions of the mask plate 18 are adjusted, the mask plate 18 is not fixed by the fixing device 72, and is supported on the balls 64, so that the plate 18 can be lightly moved. After the adjustment of the positions of the mask plate 18, the plate 18 is fixed to the mask support table 52 by the fixing device 72. To this end, the balls 64 are retracted into the unit cases 60 to allow the plate 18 to be fixed to the table 52.

While a mask-printing operation is carried out, the cleaning head 202 of the mask cleaning device 24 is not connected to the wiping head 208, and is engaged with the mask support table 52. That is, the cleaning head 202 is positioned at its retracted position. In addition, the cleaning head 202 is positioned at its lower-end position, and the wiping head 208 is positioned at its upper-end position, so that the cleaning sheet 244 and the wiping sheet 254 are positioned away from the mask 48 and accordingly do not interfere with the mask-printing operation. The two reference-mark-image taking devices 28, 29, the light source 280, and the two-dimensional-image taking device 282 are positioned at their retracted positions where those devices 28, 29, 280, 282 do not interfere with the mask-printing operation.

When the mask-printing operation is carried out, the PWB 12 which has been conveyed by the PWB conveyor 14 is stopped on the PWB support table 40 by the stopper device. Then, the PWB hold-down member of the PWB hold-down device is moved to a position above the PWB 12, and subsequently the support table 40 is moved upward, so that the PWB 12 is positioned by the positioning device and is lifted up off the respective belts supported by the stationary and movable rails 30, 32 of the PWB conveyor 14. After the PWB support table 40 presses the PWB 12 against the PWB hold-down member, a negative pressure or suction is supplied to the support table 40 to suck and hold the PWB 12.

After the PWB support table 40 sucks and holds the PWB 12, the table 40 is lowered by a small distance to be moved away from the PWB hold-down member and, after the PWB hold-down member is retracted from above the PWB 12, the PWB 12 is further moved upward by the table 40, so that the PWB 12 is brought into contact with the PWB-contact surface 200 of the mask 48. Subsequently, the printing head 134 is lowered to its lower-end position by the printing-head elevating and lowering air cylinder 136, and is further lowered by the contact-load adjusting air cylinder 138, so that the outlet-forming members 162 are brought into contact with the solder-squeeze surface 206 of the mask 48.

When the printing head 134 is lowered to cause the outlet-forming members 162 to contact the mask 48, the control device 182 controls, based on the output of the load sensors 144, the contact-load adjusting air cylinder 138 so that the outlet-forming members 162 contact the mask 48 with a prescribed load. After the contact, the thrust plate 170 is lowered to apply a thrusting force to the creamed solder. However, since the solder outlet 164 of the solder holder 150 is closed by the mask 48, the creamed solder does not come out of the outlet 164 and receives an appropriate pressure. When the printing head 134 is moved along the upper surface of the mask 48 by the printing-head moving device 132, the creamed solder held in the solder room 160 is prevented from coming out of the solder outlet 164 by a downstream one of the two outlet-forming members 162 as seen in the printing direction, and is scraped from the upper surface of the mask 48 by the upstream outlet-forming member 162, so that the creamed solder remains held in the solder room 160 and is moved on the mask 48 as the solder holder 150 is moved. Each time the solder outlet 164 faces each of the through-holes holes 51 of the mask 48, a corresponding amount of the creamed solder is squeezed into the each through-hole 51 and the excessive creamed solder is scraped by the upstream outlet-forming member 162, so that the each through-hole 51 is filled with the creamed solder. Thus, the printing head 134 provides a pressing-type printing or applying head which applies a pressure to the creamed solder stored therein, fills the through-holes 51 with the creamed solder, and applies the creamed solder to the PWB 12 as the object. This is the printing step in which the creamed solder is mask-printed on the PWB 12.

As the thrust plate 170 presses the creamed solder out of the solder room 160, the plate 170 moves downward. The air pressure in the thrusting air room of the thrusting air cylinder 172 is detected by the thrusting-pressure sensor 180, and the control device 182 controls, based on the output of the sensor 180, the air cylinder 172 so that a prescribed pressure is applied to the creamed solder present in the solder room 160. Therefore, though the amount of the creamed solder present in the solder room 160 decreases, the creamed solder can be constantly pressed with the prescribed pressure, so that the creamed solder can be squeezed into the through-holes 51 with a prescribed squeezing pressure and can be applied to corresponding print spots on the upper surface 49 of the PWB 12. After the printing of one PWB 12 is finished, the printing head 134 is elevated once so that the outlet-forming members 162 are moved away from the mask 48. In addition, the control device 182 carries out the inspection routine represented by the flow chart of FIG. 11, so that the inspecting device 26 inspects the creamed solder printed on the PWB 12.

First, at Step S1 of the inspection routine, the PWB support table 40 is lowered and the PWB 12 is moved away from the mask 48. The table 40 is lowered to the sucking position where the table 40 can press the PWB 12 against the PWB hold-down member and suck and hold the PWB 12, so that between the PWB 12 and the mask support table 52, a space is produced which can allow the planar-light source 280 and the two-dimensional-image taking device 282 to enter the space. The PWB support table 40 continues sucking and holding the PWB 12. When the table 40 is lowered to the sucking position, the positioning pins of the positioning device engage the positioning holes of the PWB 12. If the pins cannot engage the holes, the PWB 12 sucked and held by the table 40 presses the pins downward against the biasing force of the biasing device.

After the PWB 12 is moved away from the mask 48, Step S2 is carried out, that is, the inspecting device 26 carries out the inspection. To this end, the holder 314 is moved by the holder moving device 330, so that the planar-light source 280 and the two-dimensional-image taking device 282 enter the space between the PWB 12 and the mask 48 and the image taking device 282 takes a two-dimensional image of a creamed solder 380 (FIG. 9) printed on the upper, planar surface 49 of the PWB 12. Thus, the inspection needs the movement of the PWB 12 away from the mask 48 in a direction perpendicular to the PWB 12 and the mask 48, but does not need any relative movements of the PWB 12 and the mask 48 in any directions parallel to the PWB 12 and the mask 48. During the inspection, the cleaning head 202 is kept at its retracted position where the head 202 does not interfere with the inspection.

Figure 13:
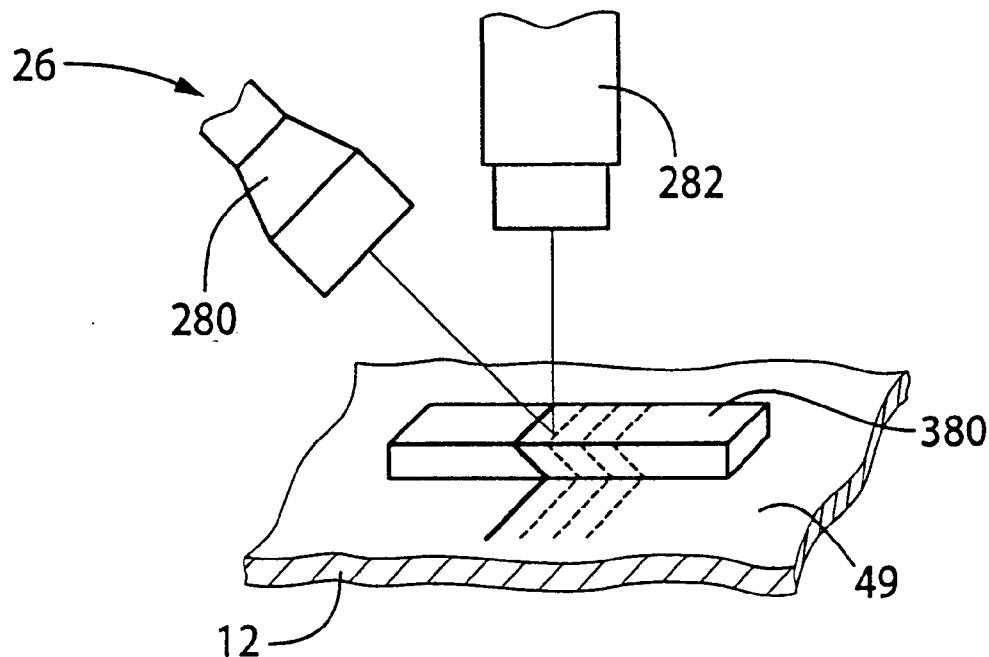
FIG. 13 is a view for explaining the manner in which the creamed solder is inspected by the inspecting device.

As described previously, each of the through-holes 51 of the mask 48 has a rectangular cross section as taken along a plane parallel to the mask 48, and the creamed solder 380 printed on the upper surface 49 of the PWB 12 has, as shown in FIG. 13, a three-dimensional shape, i.e., a rectangular-parallelepiped (e.g., cubic) shape which projects upward from the surface 49. The solder 380 has four first sides parallel to the X-axis direction, and four second sides perpendicular to the first sides and parallel to the Y-axis direction.

On the upper surface 49 of the PWB 12, a plurality of creamed solders 380 are printed at a plurality of print spots prescribed on the surface 49. In the present embodiment, only a portion (one, two, . . ., but not all) of the creamed solders 380 printed on the surface 49 is subjected to the inspection. All creamed solders 380 each of which essentially needs to be completely free of printing defects are subjected to the inspection. For example, all creamed solders 380 to which lead wires of a flat-package-type electric component are to be connected and which are printed at a very small pitch, are subjected to the inspection. However, creamed solders 380 which are other than the above-indicated creamed solders 380, i.e., each of which does not essentially need to be completely free of printing defects, i.e., is allowed to be defective to some extent, for example, creamed solders 380 printed on pads to which "leadless" electric components each having no lead wires are to be connected are subjected to a sampling inspection in which different creamed solders 380 printed at different print spots are selected for different PWBs 12 and are subjected to the inspection. Since not all the creamed solders 380 printed on each PWB 12 are subjected to the inspection, the inspection of each PWB 12 can be completed in a short time, while effectively preventing the production of a defective printed circuit board resulting from the defective printing. However, in the case where a long time can be used to inspect each PWB 12, it is possible to inspect all the creamed solders 380 printed on the each PWB 12, i.e., inspect not only all the creamed solders 380 each of which essentially needs to be completely free of printing creamed solders 380 but also all the creamed solders 380 each of which does not essentially need to be completely free of printing defects. Otherwise, it is possible not to inspect every creamed solder 380 that does not essentially need to be completely free of printing defects.

The planar-light source 280 emits, as shown in FIG. 13, a planar light to the above-indicated portion (one, two, . . ., but not all) of the creamed solders 380 printed on the PWB 12, and the two-dimensional-image taking device 282 takes a two-dimensional image of each of the creamed solders 380. To this end, the holder 314 is moved by the holder moving device 330 shown in FIG. 8, and the light source 280 and the image taking device 282 are moved, while kept their prescribed positions relative to each other, relative to the each printed creamed solder 380 as a three-dimensional object, along a predetermined movement path. In the present embodiment, the predetermined path is a straight path which extends parallel to the upper surface 49 of the PWB 12 and to the longest sides of the rectangular-parallelepiped creamed solder 380. In addition, the holder 314 is rotated by the holder-rotating air cylinder 310, so that the plane including the respective optical axes of the light source 280 and the image taking device 282 extends, as shown in FIG. 13, parallel to the longest sides of the creamed solder 380 and to the movement path.

Figure 14:
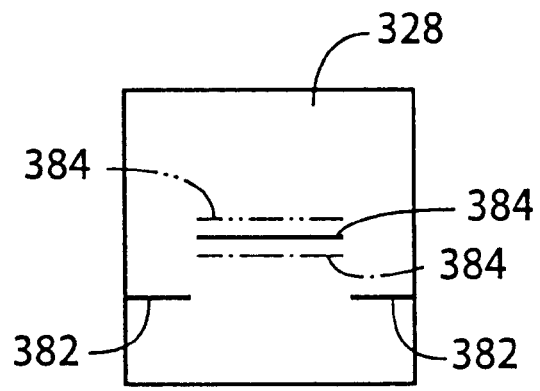
FIG. 14 is a view of an image which is formed on an image-take surface of the two-dimensional-image taking device of the inspecting device.

While the planar-light source 280 and the two-dimensional-image taking device 282 are continuously moved relative to the creamed solder 380 as described above, the image taking device 282 sequentially takes respective images of respective portions of the creamed solder 380 which are sequentially exposed to the planar light emitted by the source 280. The image taking device 282 performs a plurality of image taking operations, at a predetermined interval of time, and thereby obtains a plurality of two-dimensional images. In each of the image taking operations, the image-take surface 328 of the image taking device 282 forms, as shown in FIG. 14, respective images 382, 384 of respective portions of the PWB surface 49 and the creamed solder 380 that are exposed to the planar light. Since the creamed solder 380 projects upward from the surface 49, the image 382 of the exposed portion of the surface 49 and the image 384 of the exposed portion of the solder 380 are formed at different positions on the image-take surface 328. In addition, since the light source 280 emits the planar light toward the solder 380, and the image taking device 282 takes a two-dimensional image of the solder 380, in the state in which the plane including the respective optical axes of the two devices 280, 282 extends parallel to the longest sides of the solder 380, the two-dimensional image taken by the image taking device 282 corresponds to an image as seen in a direction inclined by 45 degrees relative to a plane which perpendicularly intersects the longest sides of the solder 380 and is inclined by 45 degrees relative to the PWB surface 49 and along which the image is taken as a cross section of the solder 380. More strictly described, the device 282 takes a two-dimensional image of only respective portions of the respective upper surfaces of the solder 380 and the PWB 12 that are exposed to the planar light.

The relative-position relationship between the planar-light source 280 and the two-dimensional-image taking device 282 is not changed, and the predetermined movement path is parallel to the surface 49 of the PWB 12. Therefore, in each of the plurality of two-dimensional images obtained by the device 282, the image 382 of the exposed portion of the PWB surface 49 is formed at substantially the same absolute position on the image-take surface 328 of the CCD camera. In addition, since the creamed solder which is correctly or properly printed on the PWB 12 has a rectangular-parallelepiped shape and the upper surface thereof has a constant height, the image 384 of the exposed portion of the solder 380 should be formed, in each of the plurality of image taking operations, at substantially the same absolute position on the image-take surface 328, and simultaneously substantially the same position relative to the position where the image 382 of the exposed portion of the PWB 12 is formed. Even in the case where the height of the upper surface of the solder 380 is not even, an image 384 is formed, as indicated at one-dot or two-dot chain line in FIG. 14, at a position near the image 384 of the exposed portion of the correctly printed solder 380 and never far from the same. Therefore, the control device 182 needs to transfer and process image data corresponding to only a limited portion of the image-take surface 328, i.e., need not transfer or process all the image data corresponding to the entire image-take surface 328. Since the control device 182 needs to transfer and process the reduced amount of image data, the device 182 can transfer and process the image data in a reduced time.

A plurality of batches of image data representing the plurality of two-dimensional images obtained in the plurality of image taking operations are stored in the two-dimensional-image-data memory 366 of the RAM 344. Based on the plurality of batches of image data stored in the memory 366, the speed at which the planar-light source 280 and the two-dimensional-image taking device 282 are moved, and the interval of time at which the plurality of two-dimensional images are taken, the control device 182 calculates a batch of image data representing a three-dimensional image of the creamed solder 380, and stores the batch of three-dimensional-image data in the three-dimensional-image-data memory 368. Based on the batch of three-dimensional-image data in the memory 368, the control device 182 calculates an average height of the upper surface of the creamed solder 380 and the volume (i.e., amount) of the creamed solder 380. In addition, the control device 182 determines X-axis-direction and Y-axis-direction positions of the solder 380 and a two-dimensional shape of the solder 380 as seen in a direction perpendicular to the PWB 12. The control device 182 compares the thus calculated or determined amount, positions, and shape with reference or correct amount, positions, and shape of the correctly or properly printed creamed solder. Thus, the control device 182 can find various sorts of printing defects such as a short amount of the creamed solder 380, a printing of the solder 380 at an erroneous or incorrect position, and an excessive amount of the solder 380. The short amount of the solder 380 may be found when the two-dimensional shape of the solder 380 is not defective but the height of at least a portion of the upper surface of the solder 380 is insufficient, or when the two-dimensional shape of the solder 380 is defective, i.e., incomplete. The inspection results, i.e., whether each solder 380 has at least one printing defect and what sort of printing defect the each solder 380 has are stored in the inspection-result memory 370. This is the inspecting step at which the PWB 12 is moved away from the mask 48 and the creamed solder or solders 380 printed at the printing step is or are inspected.

The inspection at Step S2 is followed by Step S3 to judge whether the current PWB 12 has at least one printing defect. If a negative judgment is made at Step S3, the control of the control device 182 goes to Step S11 to produce an output indicating that the PWB 12 has no printing defect. Based on this output, the PWB 12 on which the creamed solder has been printed, is carried out, and the next PWB 12 is carried in and the creamed solder is printed on the next PWB 12. When the PWB 12 is carried out, first, the PWB support table 40 being positioned at the sucking position stops sucking and holding the PWB 12, and then the table 40 is lowered to its lower-end position, so that the PWB 12 is supported on the PWB conveyor 14 and is carried out by the same 14.

On the other hand, if a positive judgment is made at Step S3, the control goes to Step S4 to judge whether the sort of printing defect is the short amount of creamed solder. If the sort of printing defect is the printing at the erroneous position or the excessive amount of creamed solder, a negative judgment is made at Step S4, and the control goes to Step S10 to stop the current operation of the present mask-printing machine and operate the alarming device 360 and the display device 362 to inform the operator of the occurrence of defective printing. Based on this information, the operator examines and solves the cause of the defecting printing.

On the other hand, if a positive judgment is made at Step S4, the control goes to Step S5 to automatically operate the mask cleaning device 24 to clean the mask 48. One of a plurality of possible causes of the short amount of creamed solder is the clogging of each through-hole 51 with the creamed solder. Accordingly, the mask 48 is cleaned to remove the solder stuck to the through-holes 51. This is the cleaning step.

When the mask 48 is cleaned, first, the cleaning head 202 is released, at its retracted position, from the connection to the mask support table 52 and is connected to the slide member 122, so that the cleaning head 202 can be moved as a unit with the wiping head 208 in the mask-clean direction. Since the two reference-mark-image taking devices 28, 29, the planar-light source 280, and the two-dimensional-image taking device 282 are positioned at their retracted positions, those devices 28, 29, 280, 282 do not interfere with the mask cleaning. In addition, since the PWB 12 is kept away from the mask 48, the cleaning head 202 is allowed to enter the space between the PWB 12 and the mask 48, without being interfered with by the PWB 12. Then, the cleaning sheet 244 and the wiping sheet 254 are fed, the respective portions of the two sheets 244, 254 that had been stained in the prior cleaning operation are taken up, and respective new or clean portions of the two sheets 244, 254 are positioned at the cleaning and wiping positions. When the cleaning sheet 244 is fed, the detergent is supplied to the detergent jetting member 226 so that the detergent is jetted from the member 226 and is absorbed into the sheet 224.

After the feeding of the cleaning and wiping sheets 244, 254, the cleaning head 202 is elevated and the wiping head 208 is lowered, so that the cleaning sheet 244 and the wiping sheet 254 are brought into contact with the PWB-contact surface 200 and the solder-squeeze surface of the mask 48, and sandwich the mask 48. Then, the detergent is supplied to the two detergent jetting members 226, 228, so that the entirety of the cleaning portion of the cleaning sheet 244 that is in contact with the mask 48 contains a sufficient amount of detergent. While, simultaneously, air is supplied to the air jetting member 264, and the ultrasonic vibrator 224 is vibrated, the slide member 122 is moved by the drive device 130, so that the cleaning head 202 and the wiping head 208 are moved as a unit along the mask 48. Thus, the printing-head moving device 132 also functions as a cleaning-head-and-wiping-head moving device. The amount of detergent that the cleaning sheet 244 fails to absorb and drops off the sheet 244 is received and collected by the palette 212.

The cleaning sheet 244 which is held in contact with the PWB-contact surface 200 of the mask 48 is moved while being vibrated by the ultrasonic vibrator 224, so that the creamed solder stuck to the surface 200 and the inner surfaces of the through-holes 51 is removed from those surfaces, is diffused into the detergent, and is absorbed into the air bubbles and fibers present in the sheet 244.

The detergent held by the cleaning sheet 244 receives the kinetic energy of the vibration of the ultrasonic vibrator 224 and accordingly moves into the through-holes 51 of the mask 48 and to the solder-squeeze surface 206 opposite to the PWB-contact surface 200. Thus, a portion of the creamed solder stuck to the solder-squeeze surface 206 is scraped by the scraper member 260, before being wiped out by the wiping sheet 254, and another portion of the solder is diffused away from the surface 206 into the detergent and is wiped by the wiping sheet 254 so as to be absorbed into the air bubbles and the fibers present in the sheet 254. A portion of the creamed solder stuck to the inner surfaces of the through-holes 51 of the mask 48 and diffused into the detergent is wiped out by the wiping sheet 254. Though the solder-squeeze surface 206 is wetted by the detergent, the surface 206 is dried by the air jetted from the air jetting member 264 of the wiping head 208.

After the cleaning head 202 and the wiping head 208 are moved from one end of the mask 48 to the other end thereof, the supplying of the detergent to the detergent jetting members 226, 228 is stopped, the vibration of the ultrasonic vibrator 224 is stopped, and the supplying of the air to the air jetting member 264 is stopped. In addition, the cleaning sheet 244 and the wiping sheet 254 are moved away from the mask 48, and the cleaning head 202 and the wiping head 208 are moved back to the cleaning-starting position, i.e., their retracted positions. During this movement, the air jetting member 232 of the cleaning head 202 continues jetting air to dry up the PWB-contact surface 200 of the mask 48. After the two heads 202, 208 are returned to their retracted positions, the two heads 202, 208 are disconnected from each other, and the cleaning head 202 is engaged with the mask support table 52, so that while a mask-printing operation is carried out, the cleaning head 202 is positioned at its retracted position.

After the cleaning of the mask 48, the control goes to Step S6 to re-print the creamed solder on the PWB 12 which had been found to have at least one printing defect. To this end, the PWB support table 40 is elevated to cause the PWB 12 to contact the mask 48, and the printing head 134 is moved along the mask 48 to print the creamed solder onto the PWB 12. After the re-printing, the PWB 12 is lowered, for the re-inspection, away from the mask 48 which is positioned and fixed on and to the mask support table 52 by the mask positioning and supporting device 20, while the PWB 12 remains sucked and held by the PWB support table 40. Thus, in order to effect the re-printing, the relative positions between the PWB 12 and the mask 48 in the directions parallel thereto are not changed. Therefore, when the PWB 12 is elevated, after the inspection, to contact again the PWB-contact surface 200 of the mask 48, the creamed solders 380 printed on the surface 49 of the PWB 12 can smoothly enter the corresponding through-holes 51 of the mask 48, without any problems.

The re-printing or second printing is effected like the printing or first printing, that is, the mask-printing operation is carried out once more over the entire portion of the PWB 12. However, the thrusting force applied to the thrust plate 170 for the re-printing is smaller than that for the first printing, and accordingly the squeezing force applied to the creamed solder for the re-printing is smaller than that for the first printing. Since the creamed solders 380 have been printed on the PWB 12 in the first printing, an excessive amount of creamed solder is likely to be squeezed into each through-hole 51 and accordingly an excessive amount of creamed solder is likely to be printed on the PWB 12 to form each creamed solder 380, unless the smaller thrusting force is employed. This is the re-printing step at which the mask-printing operation is carried out again over the entire PWB 12 such that an amount of creamed solder printed on the PWB 12 for the re-printing is smaller than that for the first printing. After the re-printing, the control goes to Step S7 to move the PWB 12 downward away from the mask 48. Like Step S1, the PWB 12 is lowered, while remaining sucked and held by the PWB support table 40, to the sucking position. After the movement of the PWB 12 away from the mask 48, the control goes to Step S8 to re-inspect the creamed solder re-printed on the PWB 12, like the first inspection carried out at Step S2.

After the re-inspection, the control goes to Step S9 to judge whether the PWB 12 has at least one printing defect. If a positive judgment is made at Step S9, the control goes to Step S10 to stop the operation of the present mask-printing machine and inform the operator of the occurrence of defective printing. On the other hand, if a negative judgment is made at Step S9, the control goes to Step S11.

It emerges from the foregoing description that, in the present embodiment, a portion of the control device 182 that calculates respective errors of X-axis-direction and Y-axis-direction relative positions between the PWB 12 and the mask 48 based on the batches of image data representing the images taken by the PWB-reference-mark-image taking device 28 and the mask-reference-mark-image taking device 29, provides a positional-error determining or finding device; and the two image taking devices 28, 29 cooperate with the position adjusting device 70 to provide a relative-position adjusting device or a positioning device. In addition, a portion of the control device 182 that carries out Step S6 provides a re-printing commanding device, which cooperates with the printing device 22 to provide a re-printing device. A portion of the control device 182 that carries out Step S5 provides a cleaning commanding device, and a portion of the control device 182 that controls, for the re-printing, the thrust plate 170 to thrust the creamed solder with a smaller thrusting force than that used for the first printing, provides a smaller-amount-printing commanding device.

Figure 15:
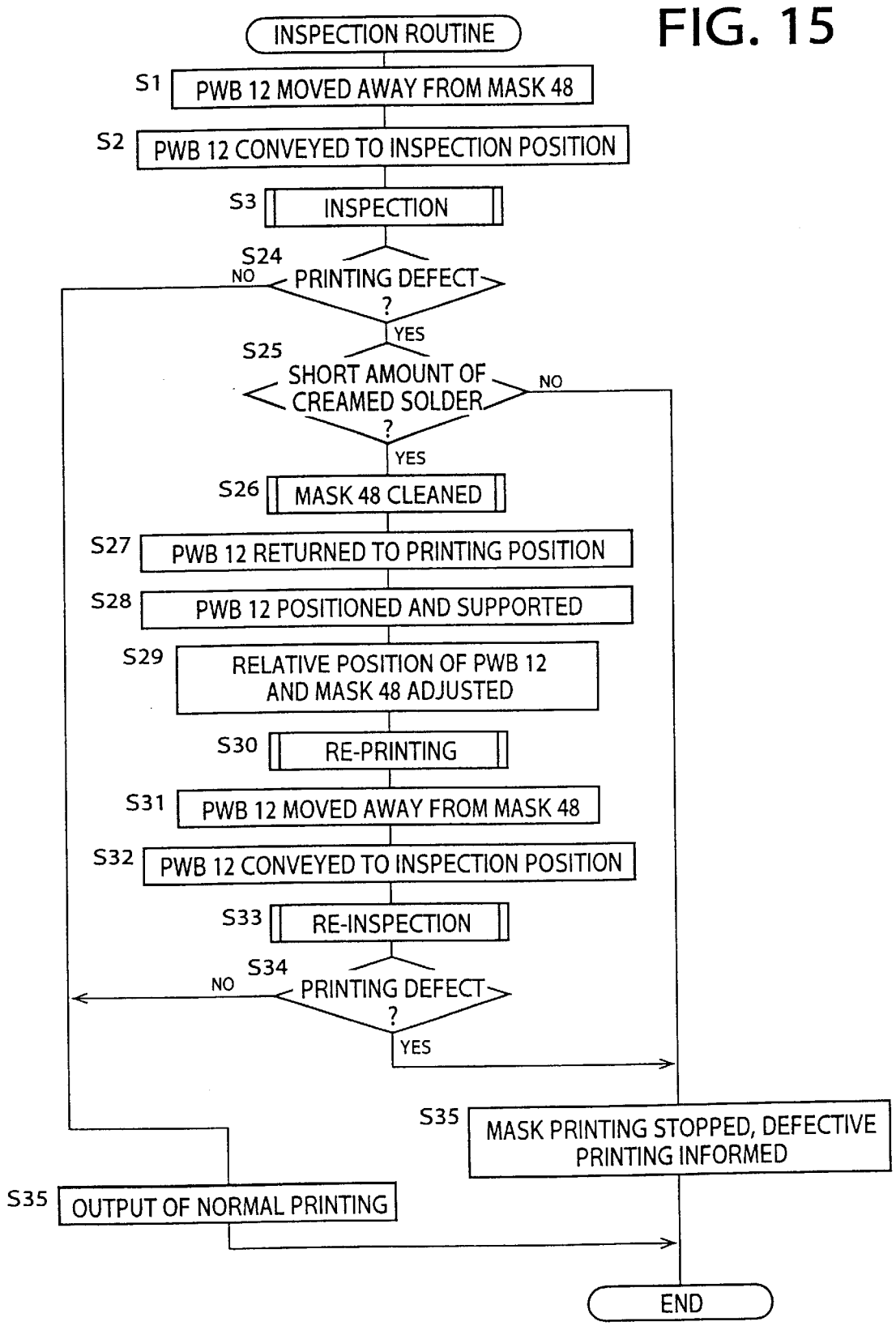
FIG. 15 is a flow chart representing another inspection routine which is stored in a ROM of a computer as part of a control device of another mask printing machine.

In the first embodiment shown in FIGS. 1 to 14, the inspecting device 26 is provided at the same position as that where the printing device 22 is provided, as seen in a direction parallel to the mask 48. However, it is possible to provide the inspecting device 26 at a position distant from that where the printing device 22 is provided, as seen in the direction parallel to the mask 48. FIG. 15 shows a flow chart representing a modified inspection routine which is employed in a second embodiment relating to the latter case. In the second embodiment, an inspecting device (not shown) identical with the inspection device 26 is provided on a downstream side of the printing device 22 as seen in the PWB-convey direction, and above the carry-out conveyor 36. That is, the inspecting device is provided at a position distant from the printing device 22 in the direction parallel to the mask 48. A stopper device (not shown) stops the movement of the PWB 12 caused by the carry-out conveyor 36, at an inspecting position where the inspecting device carries out an inspection on the PWB 12. The stopper device includes a stopper member which is movable to an operative position where the stopper member stops the movement of the PWB and to an inoperative position where the stopper member allows the movement of the PWB 12. The inspecting device (not shown), which is identical with the inspecting device 26, includes a holder holding a planar-light source and a two-dimensional-image taking device identical with the light source 280 and the image taking device 282, and a holder moving device which moves the holder so that the light source and the image taking device are moved to an arbitrary position on a horizontal plane parallel to the upper surface 49 of the PWB 12. In the present embodiment, the holder holds the light source and the image taking device such that respective optical axes of the light source and the image taking device intersect each other at the center of a cross section of a creamed solder 380 as taken along a plane inclined by 45 degrees relative to the surface 49 of the PWB 12 supported on the carry-out conveyor 36. The PWB-reference-mark-image taking device 28 and the mask-reference-mark-image taking device 29 are provided at the same position as that where the printing device 22 is provided, such that the two image taking devices 28, 29 are distant from the inspecting device. A reference-mark-image-taking-device moving device which is separate from the above-indicated holder moving device and which is identical with the holder moving device 330 employed in the first embodiment moves the two image taking devices 28, 29, in a space produced between the PWB 12 and the mask 48, to an arbitrary position on a horizontal plane to take respective images of respective reference marks provided on the PWB 12 and the mask 48.

The PWB conveying device employed in the second embodiment includes the PWB conveyor 14, the carry-in conveyor 34, and the carry-out conveyor 36 each of which is provided by a belt conveyor. The PWB 12 is placed on the two belts of each conveyor 14, 34, 36 and, as the belts are circulated, the PWB 12 is conveyed. When a belt drive device associated with each conveyor 14, 34, 36 moves or circulates the belts in opposite directions, each conveyor 14, 34, 36 can convey the PWB 12 in a forward direction from the carry-in conveyor 34 toward the carry-out conveyor 36, and a backward direction opposite to the forward direction. The PWB conveyor 14 is provided with not only a first stopper device which stops the movement of the PWB 12 in the forward direction but also a second stopper device which stops the movement of the PWB 12 in the backward direction, at a position right above the PWB support table 40. Each of the first and second stopper devices includes a stopper member which is movable to an operative position where the stopper member stops the movement of the PWB 12 and to an inoperative position where the stopper member allows the movement of the PWB 12.

Next, the inspection of the creamed solder printed on the PWB 12 in the second embodiment will be described by reference to the inspection routine represented by the flow chart of FIG. 15. The inspection routine is carried out after the printing. First, at Step S21, the PWB 12 is lowered away from the mask 48, by the PWB supporting and moving device 16, and is stopped at the sucking position where the PWB 12 is released from the suction of the PWB support table 40. Then, as the table 40 is lowered to its lower-end position, the PWB 12 is placed on the PWB conveyor 14. Step S21 is followed by Step S22 to operate the PWB conveyor 14 and the carry-out conveyor 36 to convey the PWB 12 to the inspecting position.

After the PWB 12 is conveyed to the inspecting position and stopped there by the inspection-related stopper device, Steps S23 to S26 are carried out like Steps S2 to S5 employed in the first embodiment. The inspection is carried out by moving the PWB 12 and/or the combination of the planar-light source and the two-dimensional-image taking device, relative to each other, in directions parallel to the surface 49 of the PWB 12, in a state in which the mask 48 is absent from above the PWB 12. This is the inspecting step. The PWB 12 is stopped at the inspecting position by the stopper device and, after the stopping and before the inspection, an image of the two reference marks provided on the PWB 12 is taken by the two-dimensional-image taking device employed for taking a two-dimensional image of each creamed solder 380 printed on the PWB 12. The reference marks are exposed to the planar light emitted by the planar-light source, and an image of the two reference marks of the PWB 12 is taken while the light source and the image taking device are moved relative to the reference marks. Based on a batch of image data representing the taken image, the control device 182 calculates X-axis-direction and Y-axis-direction positional errors of the PWB 12; and, based on the thus obtained positional errors, the control device 182 modifies the predetermined movement path to accurately obtain a batch of image data representing an actual three-dimensional image of each creamed solder 380 printed on the PWB 12.

If the inspection shows that the PWB 12 has no printing defects, the control goes to Step S36 to produce an output indicating a normal printing, so that the PWB 12 is carried out from the inspecting position. On the other hand, if the PWB 12 has at least one printing defect and the amount of creamed solder printed is short or insufficient, the control goes to Step S26 to carry out a mask-cleaning operation. After the mask cleaning, the control goes to Step S27 to return the PWB 12 to the printing device 22. More specifically described, the respective pairs of belts of the PWB conveyor 14 and the carry-out conveyor 36 are circulated in a direction opposite to a direction in which the belts are circulated to carry out the PWB 12, so that the PWB 12 is moved backward to the printing position where the creamed solder is re-printed on the PWB 12 by the printing device 22. The second printing-related stopper device stops the backward movement of the PWB 12, at the position right above the PWB support table 40. After the returning, the control goes to Step S28 to operate the positioning device to position the PWB 12 and operate the PWB support table 40 to lift up the PWB 12 off the PWB conveyor 14 and suck and hold the same 12.

Step S28 is followed by Step S29 to re-position the mask 48 and the PWB 12 relative to each other. To this end, the PWB support table 40 is positioned at the sucking position and, as described above in the first embodiment, first, the two reference-mark-image taking devices take respective images of the reference marks provided on the PWB 12 and the mask 48, and positional errors between the PWB 12 and the mask 48 are determined based on the taken images. Then, the fixing device 72 releases the mask 48, and the position adjusting device 70 adjusts the X-axis-direction and Y-axis-direction positions of the mask 48. After the adjusting, the fixing device 72 fixes the mask 48 to the mask support table 52. This is the re-positioning step at which the relative position between the PWB 12 and the mask 48 in the directions parallel thereto is adjusted.

After the re-positioning, Steps S30 and S31 are carried out, like Steps S6 and S7, to perform the mask-printing operation, once more, over the entire portion of the PWB 12. This is the re-printing step. After the creamed solder is re-printed on the PWB 12, the PWB support table 40 is lowered away from the mask 48 to the sucking position where the PWB 12 is released from the table 40. Then, the control goes to Steps S32 identical with Step S22 to convey the PWB 12 to the inspecting position, and goes to Step S33 to re-inspect the PWB 12. If the PWB 12 is found to have at least one printing defect, the control goes to Step S35 to inform the operator of the occurrence of defecting printing; and if the PWB 12 does not have any printing defects, the control goes to Step S36 to produce an output indicating a normal printing.

It emerges from the foregoing description that in the second embodiment, the PWB conveyor 14, the carry-out conveyor 36, and a portion of the control device 182 that controls, when the inspecting device finds at least one printing defect with the PWB 12, the two conveyors 14, 36 to be circulated in the backward direction opposite to the forward direction to normally feed the PWB 12, cooperate with one another to provide a PWB returning device which returns the PWB 12 back to the printing device 22.

An image of the reference marks on the surface 49 of the PWB 12 conveyed to, and stopped at, the inspecting position may be taken, with the two-dimensional-image taking device, by simultaneously exposing the entire surface 49 to light and taking, at once, the image of the reference marks. For example, the planar-light source may be provided with a "slit" plate having a slit that is movable to an operative position where the slit plate converts a flux of parallel lights into a planar light and to an inoperative position where the slit plate does not. In this case, when an image of the reference marks is taken, the slit plate is moved to its inoperative position so that the light source emits the flux of parallel lights produced by the beam expander. In this case, the image of the reference marks can be taken without moving the reference marks and the combination of the light source and the image taking device. Otherwise, an exclusive PWB-reference-mark-image taking device may be employed in addition to the light source and the two-dimensional-image taking device.

In place of, or in addition to, the stopper device which stops the movement of the PWB 12 at the inspecting position, it is possible to employ a positioning device including a plurality of positioning pins and a PWB supporting and moving device including a PWB support table which applies a negative pressure to the PWB 12 and holds the PWB 12 and which is elevated and lowered to elevate and lower the PWB 12. In this case, an image of the reference marks on the PWB 12 may be taken in a state in which the PWB 12 is positioned by the positioning device and is sucked and held by the PWB support table. Otherwise, it is possible that the PWB 12 which is stopped by the stopper device be just positioned by the positioning device. In either case, an image of the reference marks on the PWB 12 is taken and, based on the taken image, positional errors of the PWB 12 are calculated.

In each of the first and second embodiments, the mask cleaning device 24 is provided at the same position as that where the mask positioning and supporting device 20 and the printing device 22 are provided, and cleans the mask 48 in the state in which the mask 48 is supported by the supporting device 20. However, a mask cleaning device may be provided at a position different from that where the mask positioning and supporting device 20. In this case, a mask conveying device is employed, which conveys the mask 48 between the mask cleaning device and the mask positioning and supporting device 200. When a mask cleaning is needed, the mask 48 is released from the mask positioning and supporting device 20, and is conveyed to the mask cleaning device so as to be cleaned by the same. After the cleaning, the mask is returned to the mask positioning and supporting device, is positioned by the same, and is fixed to the mask support table 52. To this end, respective images of the reference marks on the PWB 12 and the mask 48 are taken and, based on the taken images, the relative position between the PWB 12 and the mask 48 is adjusted again.

The cross-sectional shape of each through-hole 51 is not limited to a rectangular shape, but may be a different shape such as a circular or an elliptic shape. The inspection may be performed on all the creamed solders 380 each having a different cross-sectional shape than the rectangular shape, or on a portion (one, two, . . ., but not all) of those creamed solders 380.

In the first embodiment shown in FIGS. 1 to 14, the single pair of guide rails 216 are commonly used by both the holder moving device 330 of the inspecting device 26 and the cleaning head 202 of the mask cleaning device 24. However, the device 330 and the head 202 may employ respective exclusive pairs of guide rails. That is, two exclusive guide devices may be employed to guide the respective movements of the holder 314 and the head 202.

In the first embodiment shown in FIGS. 1 to 14, the holder 314 of the inspecting device 26 may be moved by the printing-head moving device 132. That is, the printing-head moving device 132 may also be used as the holder moving device.

A single image taking device may be employed to take respective images of the reference marks provided on the mask 48 and the PWB 12. For example, an image taking device which is rotatable about an axis line parallel to the mask 48 and the PWB 12, is rotated to a first angular position where the device is opposed to the mask 48 to take an image of the reference marks on the mask 48 and a second angular position where the device is opposed to the PWB 12 to take an image of the reference marks on the PWB 12.

The PWB-reference-mark-image taking device 28 and the mask-reference-mark-image taking device 29 may be provided at a position distant from the planar-light source 280 and the two-dimensional-image taking device 282, and may be moved by a common exclusive moving device different from the holder moving device 330. Otherwise, the two image taking devices 28, 29 may be moved by respective exclusive moving devices.

The cleaning head 202 and the wiping head 208 may be moved by a common exclusive moving device different from the printing-head moving device 132. Otherwise, the two heads 202, 208 may be moved by respective exclusive moving devices.

Figure 16A:
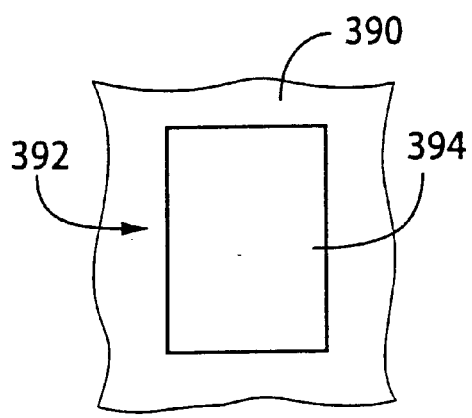
FIGS. 16A and 16B are views for explaining the manner in which a height of a projection as a three-dimensional object is inspected according to a projection inspecting method as a three-dimensional-data obtaining method.
Figure 16B:
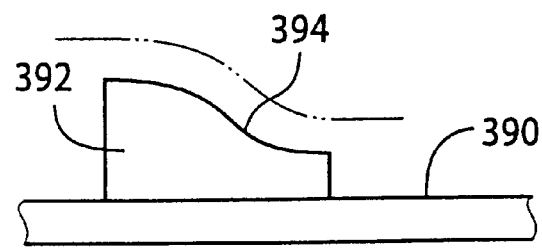

The above-described method and apparatus for obtaining the three-dimensional shape of each creamed solder 380 may be used for inspecting a printing material different than the creamed solder, such as an adhesive, which is printed by mask-printing method and apparatus, or for obtaining three-dimensional data representing a three-dimensional shape of an object different than the printing material. FIGS. 16A and 16B shows an example of those usages. FIG. 16B shows an object in the form of a projection 392 which projects upward from a horizontal reference plane 390. The projection 392 has, as shown in FIG. 16A, a rectangular shape as seen in a vertically downward direction perpendicular to the reference plane 390, but an upper surface 394 of the projection 392 has a predetermined curve, as shown in FIG. 16B. In this case, in order to inspect the projection 392, the planar-light source 280 and the two-dimensional-image taking device 282 are moved relative to the reference plane 390 along a predetermined movement path indicated at two-dot chain line in FIG. 16B. The predetermined movement path has a curve substantially corresponding to the curve or shape of the upper surface 394 of the projection 392.

In the present projection inspecting method and apparatus, the control device 182 can obtain a batch of three-dimensional image data representing the three-dimensional shape of the projection 392, by processing only the image of the upper surface 394 of the projection 392. Since the distance between the combination of the light source 280 and the image taking device 282, and the reference plane 390 that changes along the predetermined movement path is known in advance, the control device 182 can calculate the batch of three-dimensional image data without having to process the image of the reference plane 390. Respective images of respective portions of the upper surface 394 that are sequentially exposed to the planar light are formed at substantially the same location on the image-take surface 328 of the device 282. Even if the actual height of the projection 392 may be somewhat higher or lower than a reference height, the control device 182 has only to process image data corresponding to a limited area of the image-take surface 328, which contributes to reducing the time needed to complete the processing of the image data.

The control device 182 may judge whether the projection 392 is too high or too low, by judging whether the actual image of the upper surface 394 is formed in a reference range or area in which, if the height of the projection 392 is permissible, the image of the upper surface 394 of the projection 392 must fall.

In each of the illustrated embodiments, the image of each creamed solder 380 or the projection 392 is taken while the two-dimensional-image taking device 282 is continuously moved, without being stopped. However, the image may be taken by repeatedly moving and stopping the device 282.

While the present invention has been described in its preferred embodiments, the present invention is not limited to the features described in SUMMARY OF INVENTION and the features described in PREFERRED EMBODIMENTS OF INVENTION, but may be embodied with other changes, improvements, and modifications that may occur to a person skilled in the art without departing from the scope and spirit of the invention defined in the appended claims.

What is claimed is:

1. A method of printing a printing material on an object, comprising the steps of:
   printing the printing material on the object through a mask having at least one through-hole formed through a thickness thereof;
   inspecting the printing material printed on at least one portion of the object through said at least one through-hole of the mask; and
   re-printing, when the inspection shows that an amount of the printing material printed on said at least one portion of the object is short, the printing material on said at least one portion of the object through said at least one through-hole of the mask to compensate for the short amount of the printing material.

2. A method according to claim 1, wherein the printing step comprises printing the printing material on a plurality of portions of the object through the mask having a plurality of through-holes formed through the thickness thereof, wherein the inspecting step comprises inspecting the printing material printed on at least one of said plurality of portions of the object through at least a corresponding one of said plurality of through-holes of the mask, and wherein the re-printing step comprises re-printing, when the inspection shows that an amount of the printing material printed on said at least one portion of the object is short, the printing material on each of said plurality of portions of the object through a corresponding one of said plurality of through-holes of the mask.

3. A method according to claim 2, wherein the re-printing step comprises re-printing the printing material on said each portion of the object through said corresponding one through-hole of the mask, such that an amount of the printing material squeezed into said one through-hole in the re-printing step is smaller than the amount of the printing material squeezed into said one through-hole in the printing step.

4. A method according to claim 1, wherein the inspecting step comprises taking, with an image taking device, an image of a surface of the object on which the printing material has been printed, and finding, based on the taken image, the shortage of the amount of the printing material.

5. A method according to claim 4, wherein the inspecting step comprises separating, without moving the object and the mask relative to each other in a direction parallel to the object and the mask, at least one of the object and the mask from the other of the object and the mask in a direction perpendicular to the object and the mask, and moving the image taking device into a space produced between the object and the mask.

6. A method according to claim 4, wherein the inspecting step comprises moving at least one of the object and the mask relative to the other of the object and the mask, in a direction parallel to the object and the mask, and taking, with the image taking device, the image of the surface of the object in a state in which the mask is not present above the object.

7. A method according to claim 6, wherein the printing step comprises printing the printing material on a plurality of portions of the object through the mask having a plurality of through-holes formed through the thickness thereof, wherein the inspecting step comprises inspecting the printing material printed on at least one of said plurality of portions of the object through at least a corresponding one of said plurality of through-holes of the mask, wherein the re-printing step comprises re-printing, when the inspection shows that an amount of the printing material printed on said at least one portion of the object is short, the printing material on each of said plurality of portions of the object through a corresponding one of said plurality of through-holes of the mask, and wherein the method further comprises a step of positioning, before starting the printing step, at least one of the object and the mask relative to the other of the object and the mask, and a step of re-positioning, before starting the re-printing step, at least one of the object and the mask relative to the other of the object and the mask.

8. A method according to claim 1, further comprising a step of cleaning the mask, at least when the inspection shows the shortage of the printing amount.

9. A method according to claim 1, wherein the inspecting step comprises inspecting the printing material for finding at least one different sort of defect than the shortage of the amount of the printing material, and identifying a particular sort of the defect found.

10. A method according to claim 9, wherein said at least one different sort of defect comprises at least one of an excessive amount of the printing material printed on the object, and a printing of the printing material at an erroneous position on the object.

11. A mask printing apparatus, comprising:
   an object supporting device which supports an object;

a printing device which prints, through a mask having at least one through-hole formed through a thickness thereof, a printing material on the object supported by the object supporting device;

an inspecting device which inspects the printing material printed on at least one portion of the object through said at least one through-hole of the mask; and a re-printing commanding device which commands the printing device to re-print, when the inspecting device finds that an amount of the printing material printed on said at least one portion of the object is short, the printing material on said at least one portion of the object through said at least one through-hole of the mask to compensate for the short amount of the printing material.

12. An apparatus according to claim 11, wherein the inspecting device comprises an image taking device which takes an image of the printing material printed on the object by the printing device, and a data processor which processes image data representing the image taken by the image taking device to find the shortage of the amount of the printing material.

13. An apparatus according to claim 11, further comprising a positioning device which automatically moves at least one of the object supporting device and the mask relative to the other of the object supporting device and the mask, in a direction parallel to the object supported by the object supporting device, and the mask, and thereby positions at least one of the object and the mask relative to the other of the object and the mask.

14. An apparatus according to claim 13, wherein the positioning device comprises:

at least one image taking device which takes a first image of at least one reference mark provided on the object supported by the object supporting device, and a second image of at least one reference mark provided on the mask; and a positional-error finding device which finds, based on the first and second images taken by the image taking device, a positional error of the object and the mask relative to each other.

15. An apparatus according to claim 11, wherein the printing device prints the printing material on a plurality of portions of the object through the mask having a plurality of through-holes formed through the thickness thereof, wherein the inspecting device inspects the printing material printed on at least one of said plurality of portions of the object through at least a corresponding one of said plurality of through-holes of the mask, wherein the re-printing commanding device commands, when the inspecting device finds that an amount of the printing material printed on said at least one portion of the object is short, the printing device to re-print the printing material on each of said plurality of portions of the object through a corresponding one of said plurality of through-holes of the mask.

16. An apparatus according to claim 15, wherein the re-printing commanding device comprises a smaller-amount-printing commanding device which commands the printing device to re-print the printing material on said each portion of the object through said corresponding one through-hole of the mask, such that an amount of the printing material squeezed into said one through-hole for the re-printing is smaller than the amount of the printing material squeezed into said one through-hole for the printing.

17. An apparatus according to claim 11, further comprising a cleaning-device which automatically cleans the mask.

18. An apparatus according to claim 17, further comprising a cleaning commanding device which commands, at least when the inspecting device finds the shortage of the amount of the printing material, the cleaning device to clean the mask.

19. An apparatus according to claim 11, wherein the inspecting device is provided at a position distant from the printing device in a direction parallel to the mask, and comprises a moving device which moves the object from the printing device to the inspecting device, and wherein the apparatus further comprises an object returning device which returns, when the inspecting device finds the shortage of the amount of the printing material, the object to the printing device.

20. A method of printing a printing material on an object, comprising the steps of:

printing the printing material on the object through a mask having at least one through-hole formed through a thickness thereof, inspecting the printing material printed on at least one portion of the object through said at least one through-hole of the mask; and re-printing, when the inspection shows that an amount of the printing material printed on said at least one portion of the object is short, the printing material on said at least one portion of the object through said at least one through-hole of the mask to compensate for the short amount of the printing material, wherein the re-printing step comprises changing at least one printing condition employed in the printing step, so that an amount of the printing material that would be squeezed, in the re-printing step, into said at least one through-hole on an assumption that said at least one through-hole is empty is smaller than the amount of the printing material squeezed into said at least one through-hole in the printing step.

21. A method according to claim 20, wherein the step of changing said at least one printing condition comprises decreasing at least one of (a) a squeezing force with which the printing material is squeezed into said at least one through-hole, and (b) a time duration during which the printing material is squeezed into said at least one through-hole.

22. A mask printing apparatus, comprising:

an object supporting device which supports an object;

a printing device which prints, through a mask having at least one through-hole formed through a thickness thereof, a printing material on the object supported by the object supporting device;

an inspecting device which inspects the printing material printed on at least one portion of the object through said at least one through-hole of the mask; and a re-printing commanding device which commands the printing device to reprint, when the inspecting device finds that an amount of the printing material printed on said at least one portion of the object is short, the printing material on said at least one portion of the object through said at least one through-hole of the mask to compensate for the short amount of the printing material, wherein the re-printing commanding device commands the printing device to change at least one printing condition employed for the printing, so that an amount of the printing material that would be squeezed, for the re-printing, into said at least one through-hole on an assumption that said at least one through-hole is empty is smaller than the amount of the printing material squeezed into said at least one through-hole for the printing.

23. An apparatus according to claim 22, wherein the printing device comprises a printing-material squeezing device which squeezes the printing material into said at least one through-hole of the mask, and wherein the re-printing commanding device commands the printing-material squeezing device to decrease at least one of (a) squeezing force with which the printing material is squeezed into said at least one through-hole, and (b) a time duration during which the printing material is squeezed into said at least one through-hole.

* * * * *